United States Patent
Takada et al.

(10) Patent No.: US 11,551,756 B2
(45) Date of Patent: Jan. 10, 2023

(54) MEMORY DEVICE

(71) Applicant: Kioxia Corporation, Tokyo (JP)

(72) Inventors: Marie Takada, Yokohama (JP); Masanobu Shirakawa, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/188,046

(22) Filed: Mar. 1, 2021

(65) Prior Publication Data

US 2022/0059164 A1     Feb. 24, 2022

(30) Foreign Application Priority Data

Aug. 24, 2020 (JP) .............................. JP2020-140967

(51) Int. Cl.
*G06F 3/06* (2006.01)
*G11C 16/04* (2006.01)
(Continued)

(52) U.S. Cl.
CPC ........ *G11C 16/0433* (2013.01); *G06F 3/0604* (2013.01); *G06F 3/0608* (2013.01);
(Continued)

(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40;
(Continued)

(56) References Cited

U.S. PATENT DOCUMENTS 5,936,890 A * 8/1999 Yeom ................ G11C 16/3454
                                                             365/185.12
7,342,830 B1 * 3/2008 Chen ................ G11C 16/3454
                                                             365/185.22

(Continued)

FOREIGN PATENT DOCUMENTS

JP      2019-161059 A     9/2019

OTHER PUBLICATIONS

Y. Ma, Y. Li, E. C. Kan and J. Bruck, "Reliability and hardware implementation of rank modulation flash memory," 2015 15th Non-Volatile Memory Technology Symposium (NVMTS), 2015, pp. 1-5, doi: 10.1109/NVMTS.2015.7457493. (Year: 2015).*

(Continued)

*Primary Examiner* — Daniel C. Chappell
(74) *Attorney, Agent, or Firm* — Oblon, McClelland, Maier & Neustadt, L.L.P.

(57) ABSTRACT

A memory device according to one embodiment includes a memory cell array, bit lines, amplifier units, a controller, and a register. The memory cell array includes a memory cell that stores data nonvolatilely. The bit lines are connected to the memory cell array. The sense amplifier units are connected to the bit lines, respectively. The controller performs a write operation. The register stores status information of the write operation. The memory cell array includes a first storage region specified by a first address. The plurality of sense amplifier modules include a buffer region capable of storing data.

16 Claims, 27 Drawing Sheets

(51) Int. Cl.
 G11C 16/26 (2006.01)
 G11C 16/10 (2006.01)
 G11C 11/56 (2006.01)
(52) U.S. Cl.
 CPC .......... *G06F 3/0652* (2013.01); *G06F 3/0659* (2013.01); *G06F 3/0679* (2013.01); *G11C 16/10* (2013.01); *G11C 16/26* (2013.01); *G11C 11/5621* (2013.01); *G11C 11/5671* (2013.01)
(58) Field of Classification Search
 CPC ....... G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06K 9/00–6298; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 27/00–3293; H01L 2225/00–1094; H03M 7/00–707; H04L 9/00–38; H04L 12/00–66; H04L 41/00–5096; H04L 49/00–9094; H04L 61/00–6095; H04L 67/00–42
 See application file for complete search history.

(56) References Cited

U.S. PATENT DOCUMENTS

| | | | | |
|---|---|---|---|---|
| 9,047,955 B2* | 6/2015 | Cometti | ................. | G11C 16/06 |
| 9,195,586 B2* | 11/2015 | Cometti | ................. | G11C 16/00 |
| 10,763,277 B2 | 9/2020 | Oike et al. | | |
| 2002/0083381 A1* | 6/2002 | Dover | ................. | G11C 16/3454 714/38.12 |
| 2002/0083385 A1* | 6/2002 | Dover | ................. | G11C 16/3459 714/719 |
| 2003/0128589 A1* | 7/2003 | Roohparvar | ..... | G11C 29/50004 365/185.22 |
| 2004/0250177 A1* | 12/2004 | Bychkov | ............. | G06F 11/1068 714/E11.038 |
| 2006/0026489 A1* | 2/2006 | Noda | ................... | G06F 11/1068 714/E11.038 |
| 2008/0205138 A1* | 8/2008 | Wang | ................. | G11C 16/0483 365/189.05 |
| 2011/0194353 A1* | 8/2011 | Hwang | ............. | G11C 16/3454 365/185.22 |
| 2013/0176784 A1* | 7/2013 | Cometti | ............... | G11C 29/028 365/185.11 |
| 2013/0227200 A1* | 8/2013 | Cometti | ................ | G06F 3/0679 711/103 |
| 2014/0215122 A1* | 7/2014 | Li | .......................... | G11C 29/82 711/103 |
| 2018/0261290 A1* | 9/2018 | Uehara | ............. | G11C 16/3459 |
| 2018/0342305 A1* | 11/2018 | Cha | .................... | G11C 13/0035 |
| 2019/0378855 A1 | 12/2019 | Kim et al. | | |
| 2019/0392908 A1 | 12/2019 | Lee et al. | | |
| 2020/0013470 A1* | 1/2020 | Nishikawa | ......... | G11C 16/3495 |
| 2020/0066322 A1* | 2/2020 | Maeda | ................ | G11C 11/4074 |

OTHER PUBLICATIONS

S. I. Park, D. Shin and E. G. Han, "Adaptive program verify scheme for improving NAND flash memory performance and lifespan," 2012 IEEE Asian Solid State Circuits Conference (A-SSCC), 2012, pp. 57-60, doi: 10.1109/IPEC.2012.6522626. (Year: 2012).*

R. J. Burns, A. D. Baker and D. E. Hmcir, "Strategies for Reliable ARC Flash Detection in Low-Voltage Switchgear: Copyright Material IEEE, Paper No. PCIC-2018-14," 2018 IEEE Petroleum and Chemical Industry Technical Conference (PCIC), 2018, pp. 119-126, doi: 10.1109/PCIC31437.2018.9080457. (Year: 2018).*

* cited by examiner

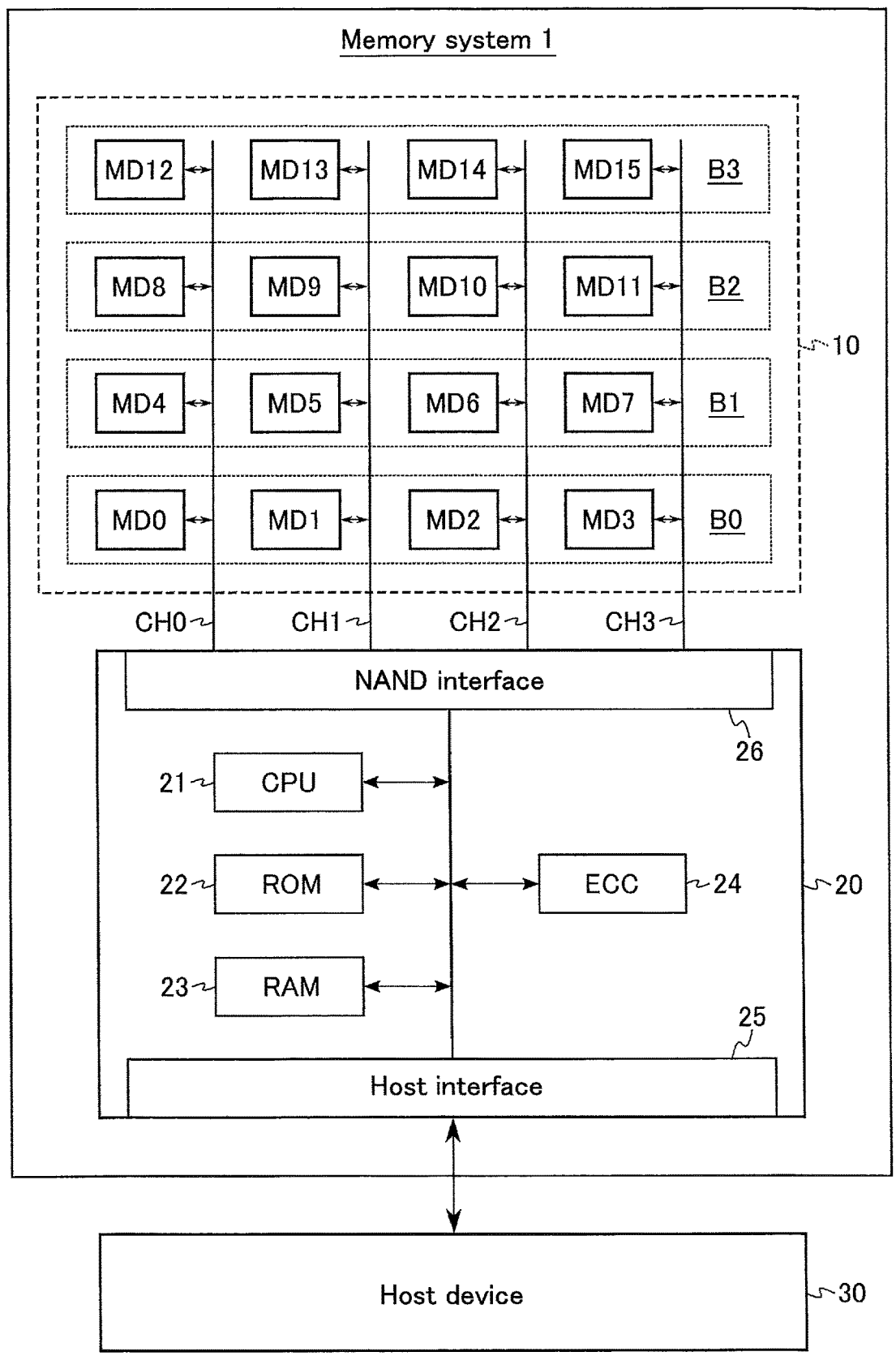
F I G. 1

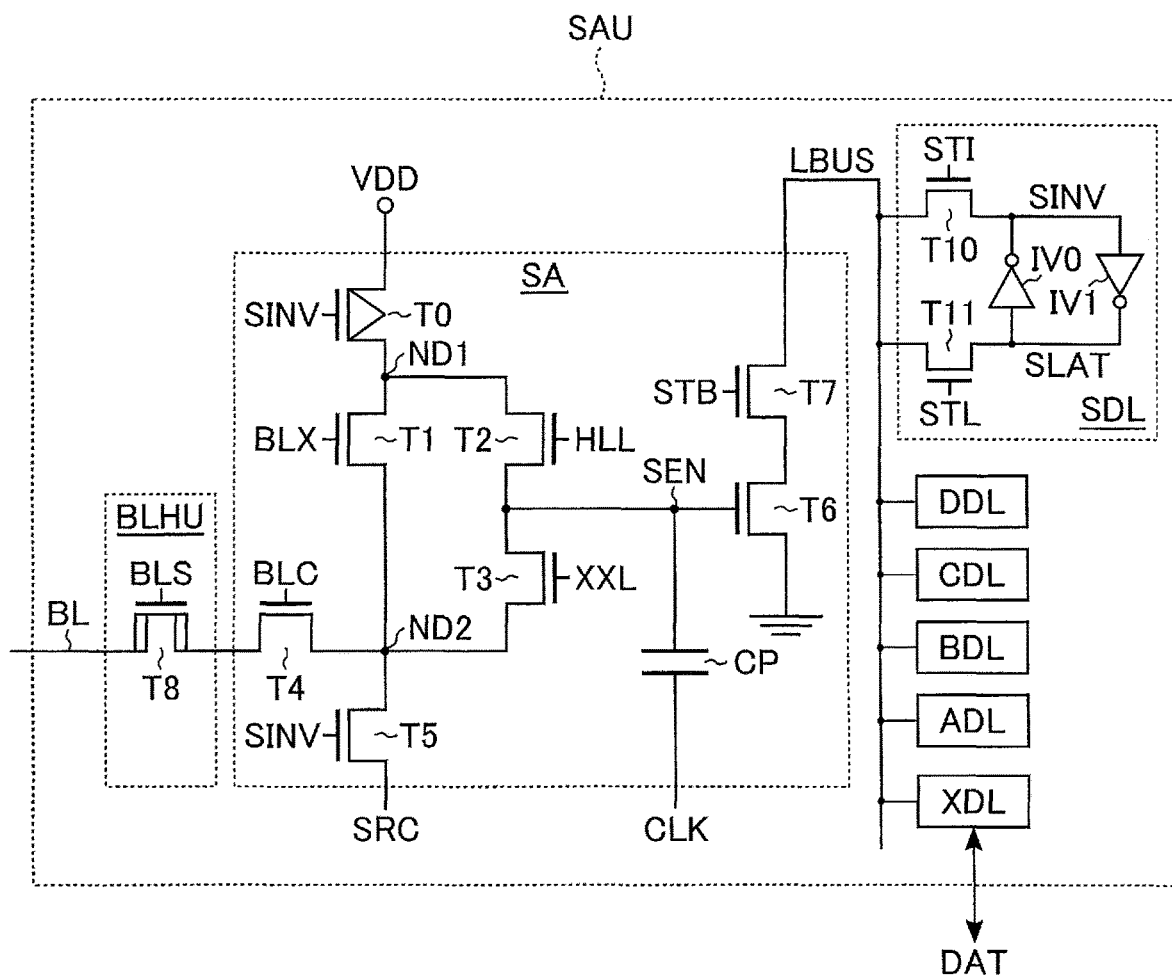
F I G. 4

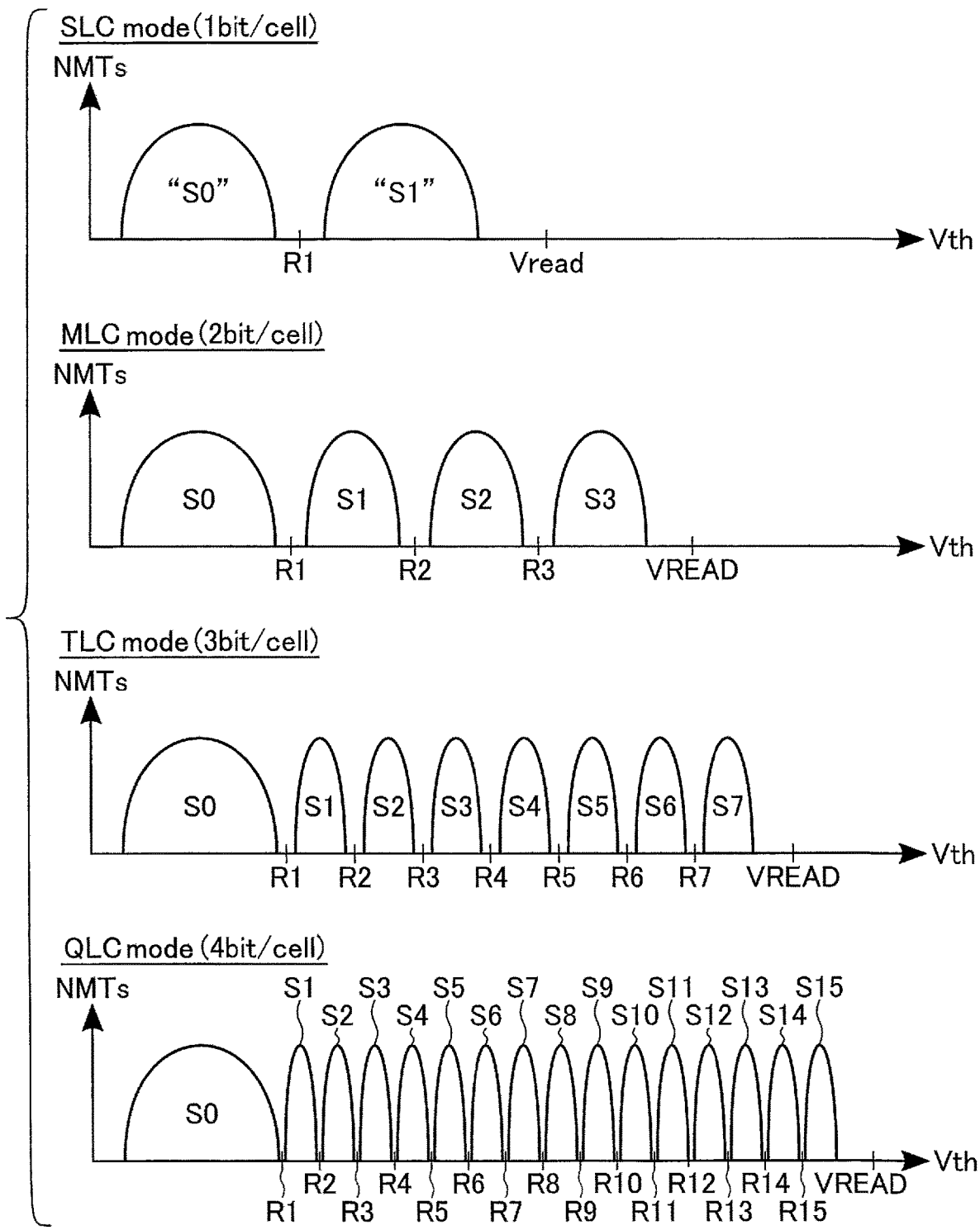
F I G. 5

| I/O0 | I/O1 | I/O2 | I/O3 | I/O4 | I/O5 | I/O6 | I/O7 |
|---|---|---|---|---|---|---|---|
| Program fail (Loop Max) | 0 | 0 | 0 | 0 | True busyn | Cache busyn | WPn |

| I/O0 | I/O1 | I/O2 | I/O3 | I/O4 | I/O5 | I/O6 | I/O7 |
|---|---|---|---|---|---|---|---|
| Program fail (Loop Max) | Defect detection (lower page) | Defect detection (middle page) | Defect detection (upper page) | 0 | True busyn | Cache busyn | WPn |

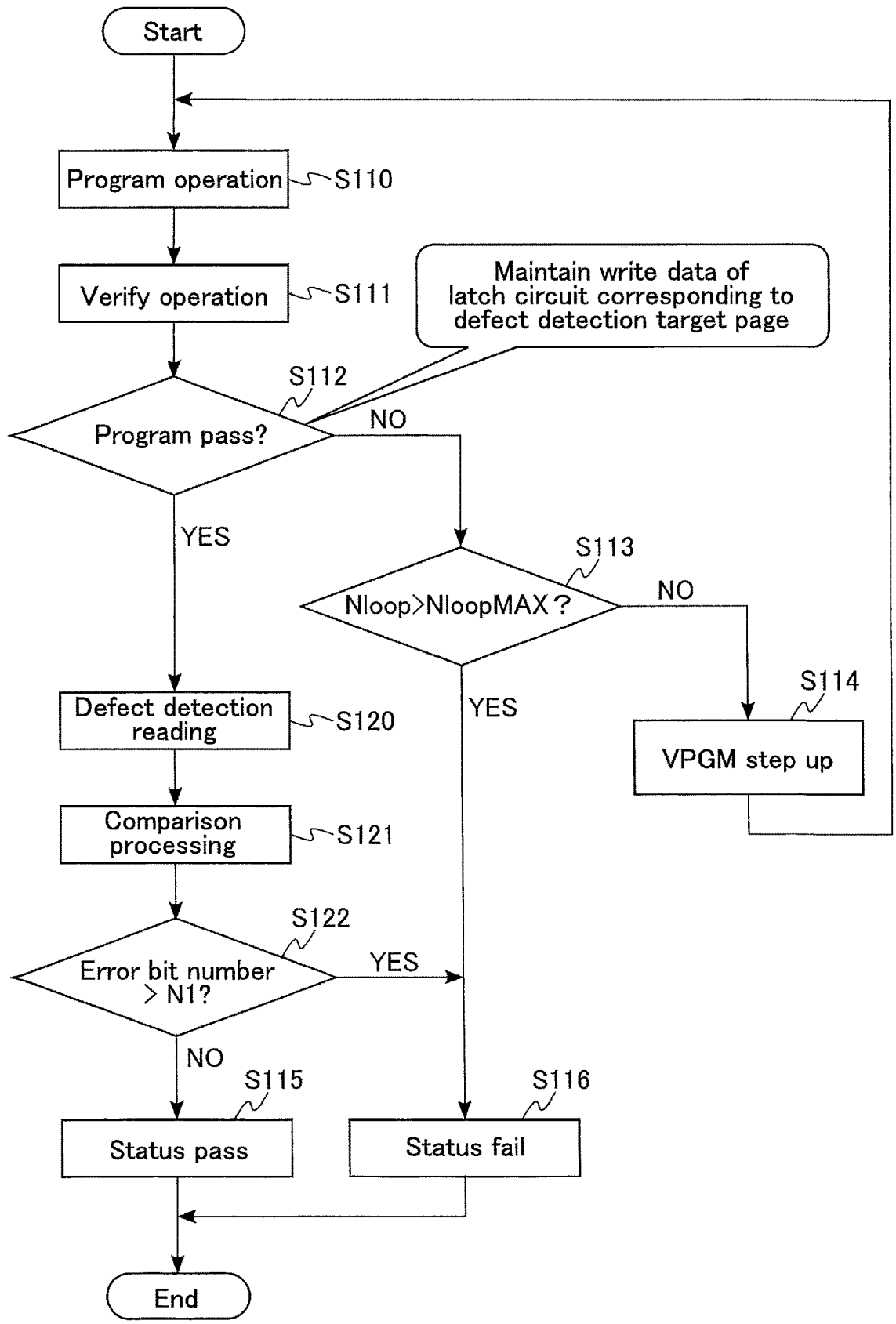
F I G. 15

| Time | Operation | Data retained in latch circuit | | | | | |
|---|---|---|---|---|---|---|---|
| | | SDL | ADL | BDL | CDL | DDL | XDL |
| t0 | Start of writing | | Lower bit write data | Middle bit write data | Upper bit write data | | |
| t1 | End of writing | | Lower bit write data | Invalid data | Invalid data | | |
| t2 | Defect detection reading | R1 read result | Lower bit write data | Invalid data | Invalid data | | |
| t3 | | | Lower bit write data | Invalid data | Invalid data | R1 read result | |
| t4 | | R5 read result | Lower bit write data | Invalid data | Invalid data | | |
| t5 | | | Lower bit write data | Invalid data | Invalid data | Lower bit write data | |
| t6 | Comparison processing (EXOR) | | Lower bit write data | Invalid data | Invalid data | Lower bit write data | Expected-value comparison result |

F I G. 17

Command sequence of defect detection operation
(Comparative example of first embodiment)
(1) Transfer of lower page data
(2) Transfer of middle page data
(3) Transfer of upper page data    (4) Execution of write operation
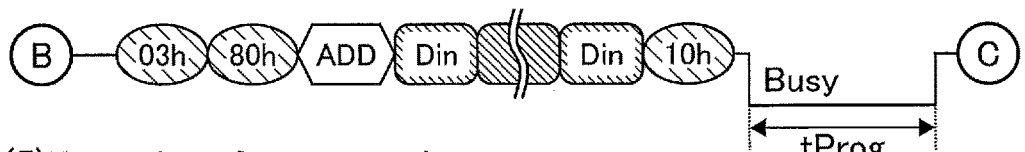
(5) Execution of status read
(6) Execution of lower page reading    (7) Execution of defect detection processing
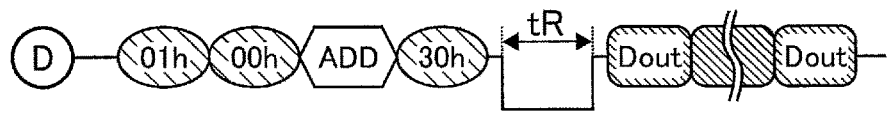
FIG. 19

Writing sequence using channel CH0 (Comparison example of first embodiment)

Writing sequence using channel CH0 (First embodiment)

Command sequence of write operation (Defect detection mode: SLC)

Command sequence of write operation (Defect detection mode: MLC)

Command sequence of write operation (Defect detection mode: QLC)
(1) Transfer of lower page data
(2) Transfer of middle page data
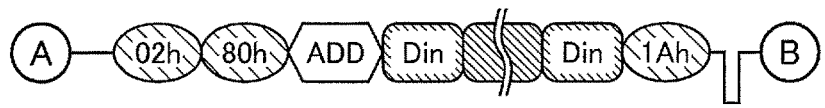
(3) Transfer of upper page data
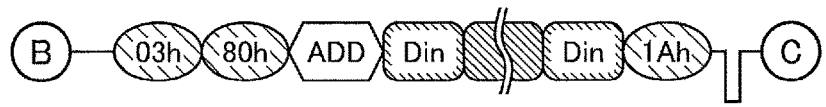
(4) Transfer of top page data      (5) Execution of write operation
(6) Execution of status read
FIG. 24

| Prefix command | Write mode | | | |
|---|---|---|---|---|
| | SLC | MLC | TLC | QLC |
| X1h | L | L | L | L |
| X2h | | U | M | M |
| X3h | | L/U | U | U |
| X4h | | | L/M | T |
| X5h | | | L/U | L/M |
| X6h | | | M/U | L/U |
| X7h | | | L/M/U | L/T |
| X8h | | | | M/U |
| X9h | | | | M/T |
| XAh | | | | U/T |
| XBh | | | | L/M/U |
| XCh | | | | M/U/T |
| XDh | | | | L/M/U/T |
F I G. 25
Command sequence of setting change operation (Threshold change)
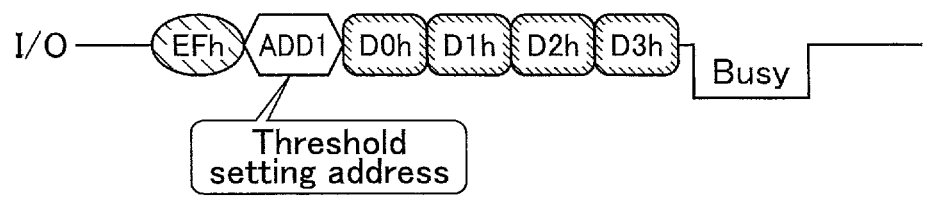
F I G. 26

Command sequence of setting change operation (Read voltage change)
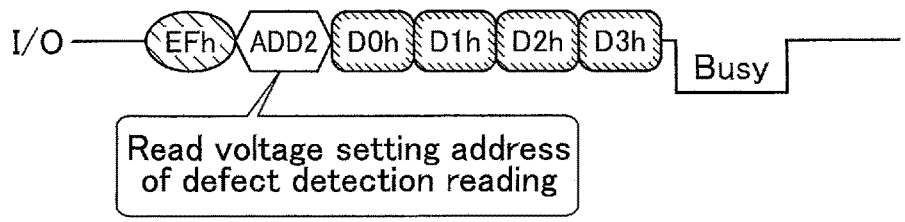
F I G. 27
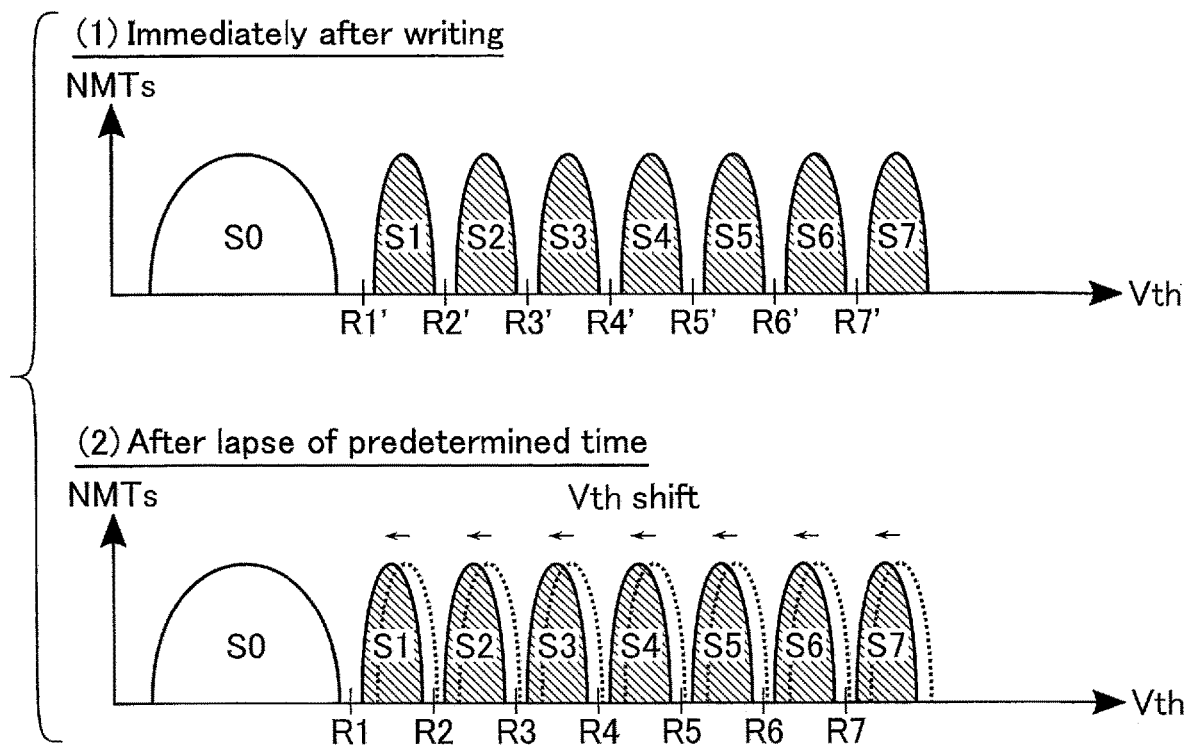
F I G. 28

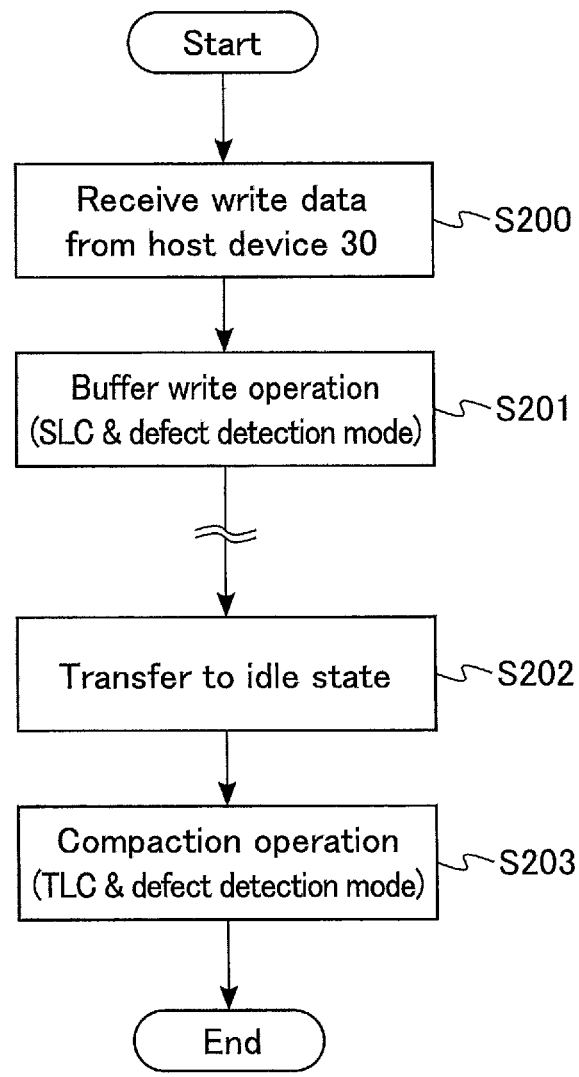
F I G. 29

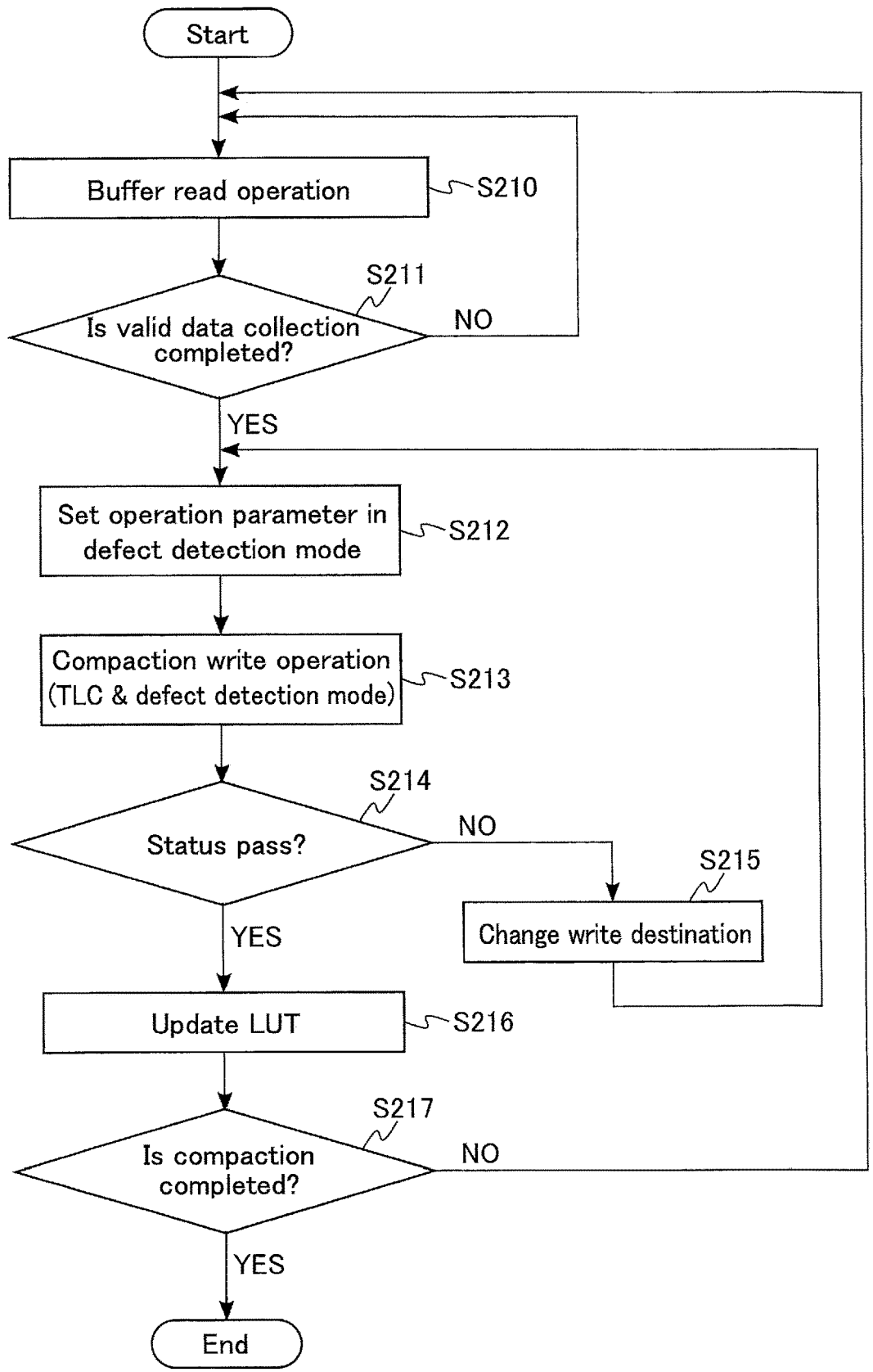
F I G. 30

Command sequence of compaction operation (Second embodiment)
(1) 1 page reading and error correction processing
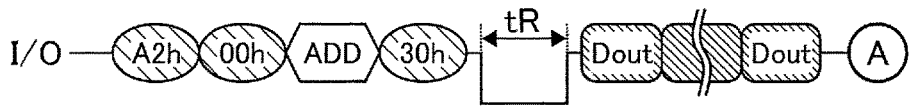
(2) 1 page reading and error correction processing
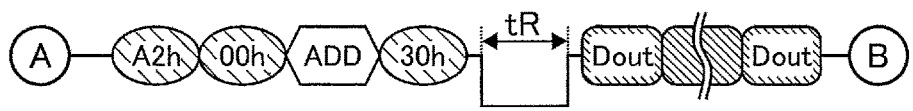
(3) 1 page reading and error correction processing
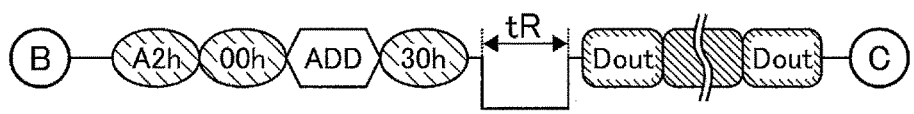
(4) Transfer of read lower page data
(5) Transfer of read middle page data
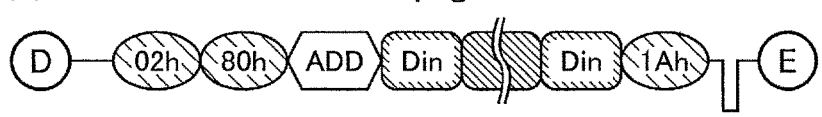
(6) Transfer of read upper page data   (7) Execution of write operation
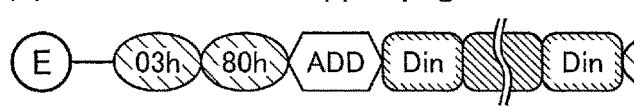 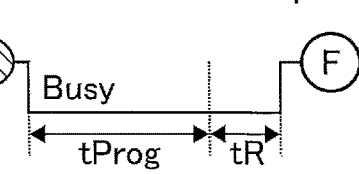
(8) Execution of status read
FIG. 31

| Write more | |
|---|---|
| Buffer writing | Compaction |
| SLC | MLC |
| SLC | TLC |
| SLC | QLC |
| MLC | TLC |
| MLC | QLC |
| TLC | QLC |

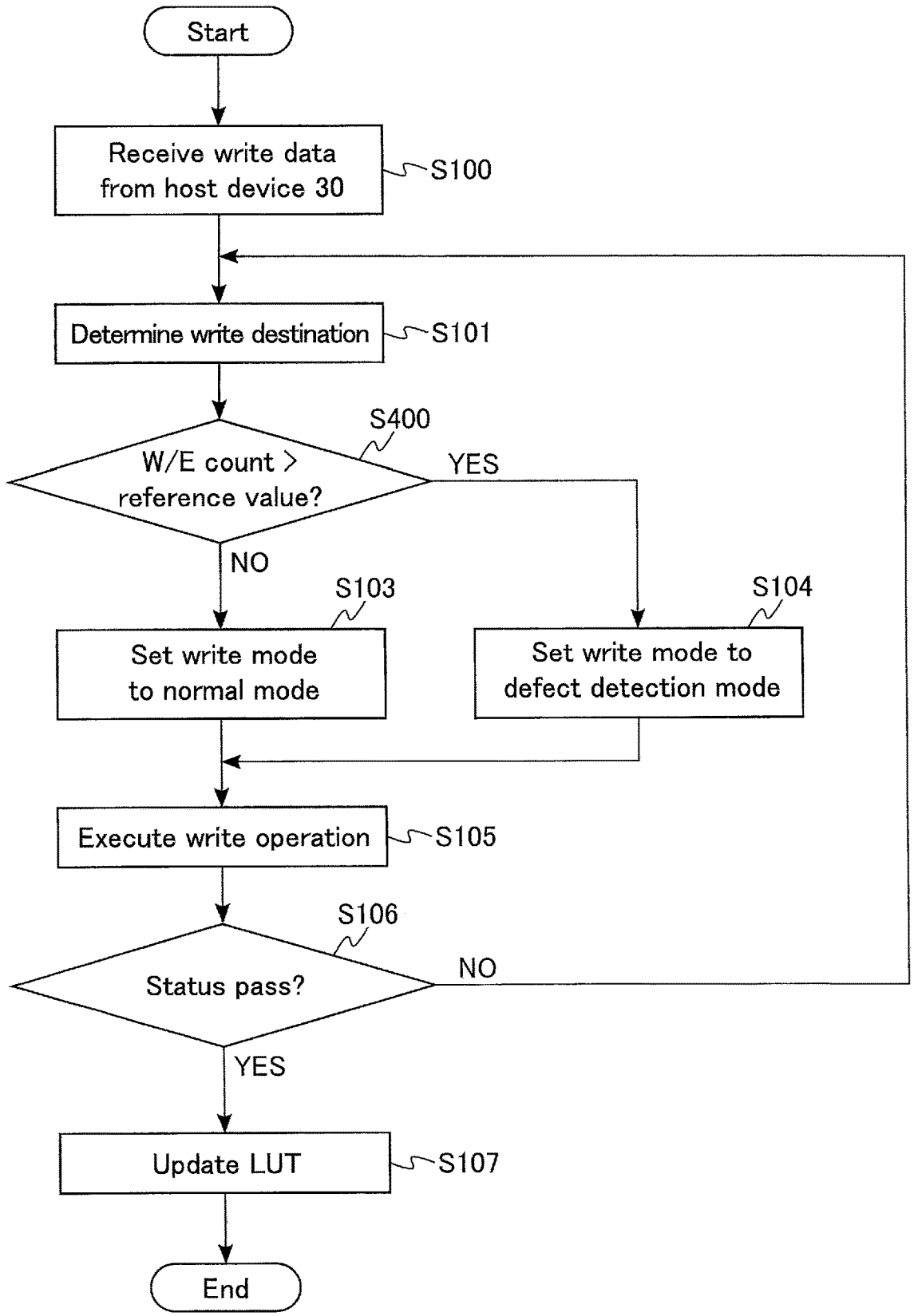
F I G. 35

MEMORY DEVICE

CROSS-REFERENCE TO RELATED APPLICATIONS

This application is based upon and claims the benefit of priority from Japanese Patent Application No. 2020-140967, filed Aug. 24, 2020, the entire contents of which are incorporated herein by reference.

FIELD

Embodiments described herein relate generally to a memory device.

BACKGROUND

There is known a NAND-type flash memory capable of storing data in a nonvolatile manner.

BRIEF DESCRIPTION OF THE DRAWINGS

FIG. 1 is a block diagram showing an example of a configuration of a memory system according to a first embodiment;

FIG. 4 is a circuit diagram showing an example of a circuit configuration of a sense amplifier unit included in a sense amplifier module included in the memory device according to the first embodiment;

FIG. 5 is a schematic diagram showing an example of a distribution of threshold voltage of a memory cell transistor in the memory system according to the first embodiment;

FIG. 15 is a flowchart showing an example of the write operation in the defect detection mode in the memory device according to the first embodiment;

FIG. 17 is a table showing an example of the method of using the latch circuit in the write operation in the defect detection mode in the memory device according to the first embodiment;

FIG. 19 is a schematic diagram showing an example of a command sequence of a defect detection operation in Comparative Example of the first embodiment;

FIG. 24 is a schematic diagram showing an example of the command sequence of the write operation in the defect detection mode in the first variation of the first embodiment;

FIG. 25 is a table showing an example of a combination of a prefix command and a page as a defect detection target in a second variation of the first embodiment;

FIG. 26 is a schematic diagram showing an example of a command sequence of a setting change operation in a third variation of the first embodiment;

FIG. 27 is a schematic diagram showing an example of the command sequence of the setting change operation in a fourth variation of the first embodiment;

FIG. 28 is a schematic diagram showing an example of a change of the distribution of the threshold voltage of the memory cell transistor;

FIG. 29 is a flowchart showing an example of a write operation in a memory system according to a second embodiment;

FIG. 30 is a flowchart showing an example of a compaction operation in the memory system according to the second embodiment;

FIG. 31 is a schematic diagram showing an example of a command sequence of the compaction operation in the memory system according to the second embodiment;

FIG. 35 is a flowchart showing an example of a write operation in a memory system according to a fourth embodiment.

DETAILED DESCRIPTION

Figure 2:
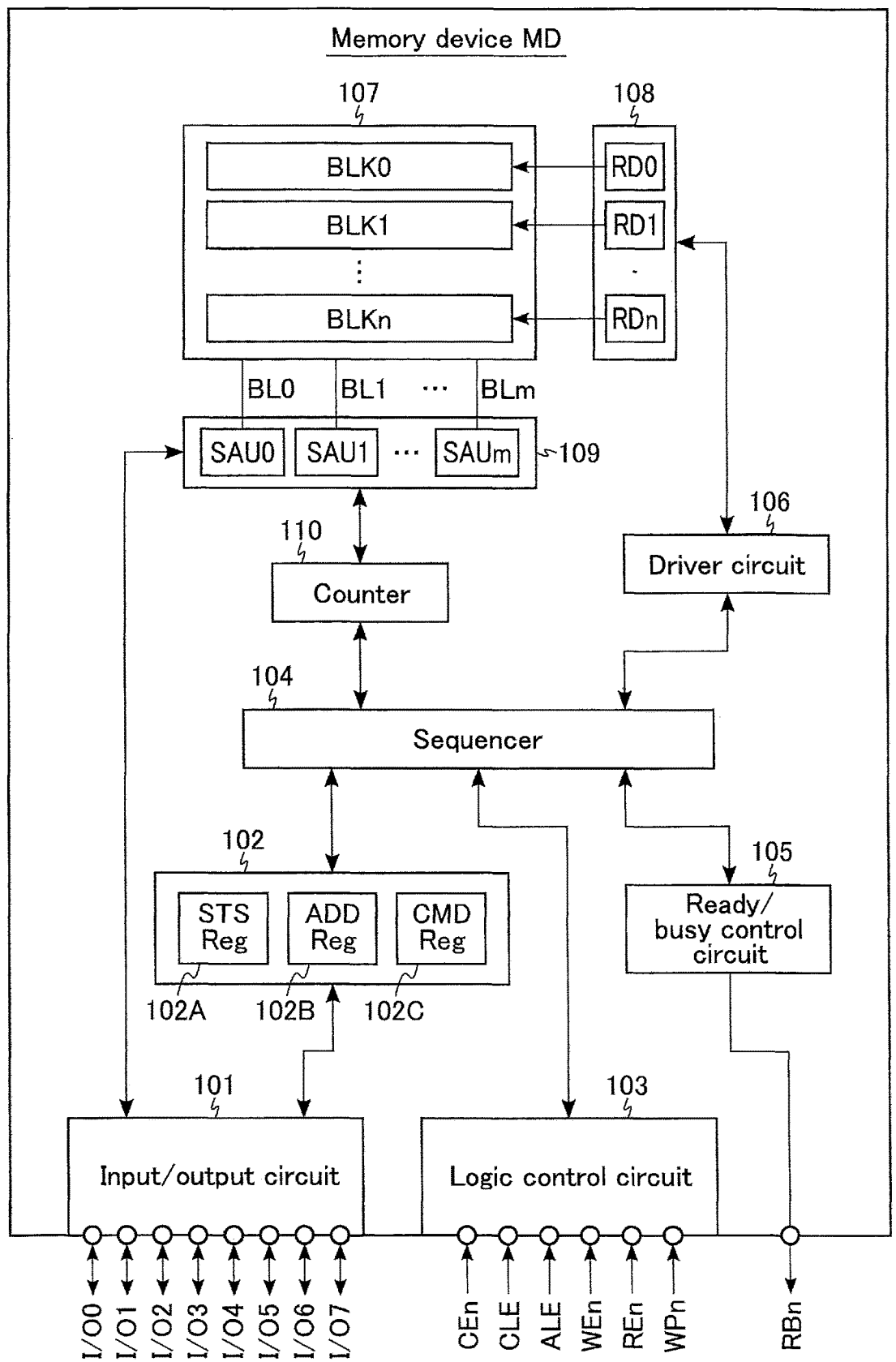
FIG. 2 is a block diagram showing an example of a memory device according to the first embodiment.

In general, according to one embodiment, a memory device of an embodiment includes a memory cell array, a plurality of bit lines, a plurality of sense amplifier units, a controller, and a register. The memory cell array includes a memory cell that stores data nonvolatilely. The plurality of bit lines are connected to the memory cell array. The plurality of sense amplifier units are connected to the plurality of bit lines, respectively. The controller performs a write operation. The register stores status information of the write operation. The memory cell array includes a first storage region specified by a first address. The plurality of sense amplifier modules include a buffer region capable of storing data. After the controller receives a first prefix command, when the controller receives a first command set including a first command indicating the write operation, the first address, and first data, the controller stores the first data in the buffer region and writes the first data stored in the buffer region in the first storage region. After the controller writes the first data in the first storage region, the controller reads second data from the first storage region while maintaining the first data in the buffer region, and stores the read second data in the buffer region. The controller compares the first data and the second data stored in the buffer region, and updates the status information based on the comparison result.

Hereinafter, embodiments will be described with reference to the drawings. The embodiments to be described below exemplify apparatuses and methods for embodying the technical concepts of the invention. The drawings are schematic or conceptual, and the dimensions, ratios, and the like in the respective drawings are not necessarily identical to those in reality. The technical idea of the present invention is not specified by the shapes, structures, and layouts of the constituent parts.

In the following explanation, the same reference numerals denote constituent elements having almost the same functions and arrangements. A number just after a character constituting a reference numeral is referred to by the reference numeral containing the same character and is used for distinguishing the components having a similar configuration. Similarly, character just after a number constituting a reference numeral is referred to by the reference numeral containing the same number and is used for distinguishing the components having a similar configuration.

[1] First Embodiment

Hereinafter, a memory system 1 in a first embodiment will be described.

[1-1] Configuration

[1-1-1] Overall Configuration of Memory System

FIG. 1 shows an example of a configuration of the memory system according to the first embodiment. As shown in FIG. 1, the memory system 1 according to the first embodiment includes, for example, a memory set 10 and a memory controller 20. The memory system 1 is connected to an external host device 30 and can execute an operation in accordance with a command from the host device 30.

The memory set 10 includes a plurality of memory devices MD0 to MD15. The memory devices MD are each a NAND flash memory that stores data nonvolatilely and are formed on different semiconductor chips. The number of the memory devices MD included in the memory set 10 can be designed to be any number. A detailed configuration of the memory device MD will be described later.

The memory controller 20 is, for example, SoC (System on Chip) and issues instructions for reading, writing, erasing, or the like to each of the memory devices MD0 and MD15, in response to an instruction from the host device 30. The memory controller 20 includes, for example, a central processing unit (CPU) 21, a read only memory (ROM) 22, a random access memory (RAM) 23, an error correction code (ECC) circuit 24, a host interface circuit 25, and a NAND interface circuit 26.

The CPU 21 controls the overall operation of the memory controller 20. The CPU 21 issues a command according to the instruction received from the host device 30, for example, and transmits the issued command to the memory device MD. Furthermore, the CPU 21 executes various processes for managing a memory space of the memory device MD, such as garbage collection and wear leveling.

The ROM 22 is a read-only storage apparatus that stores data nonvolatilely. The ROM 22 stores, for example, the control program, control data, and the like of the memory controller 20.

The RAM 23 is a storage apparatus used as a work area of the CPU 21. The RAM 23 stores, for example, a lookup table LUT for managing the storage region of the memory device MD. As the RAM 23, for example, a volatile memory such as dynamic random access memory (DRAM) or static random access memory (SRAM) is used. The RAM 23 is also used as a temporary storage region for the memory controller 20. The RAM 23 temporarily stores, for example, write data received from the host device 30 and read data received from the memory device MD. A storage apparatus such as the RAM 23 may be externally connected to the memory controller 20.

The ECC circuit 24 executes error correction processing of data. For example, during write operation, the ECC circuit 24 generates a parity based on the write data received from the host device 30 and attaches the generated parity to the write data. During read operation, the ECC circuit 24 generates a syndrome based on read data received from the memory device MD and detects and corrects an error in the read data based on the generated syndrome.

The host interface circuit 25 is connected to the host device 30 and controls transfer of data, commands, and addresses between the memory controller 20 and the host device 30. For example, the host interface circuit 25 may support communication interface standards such as Serial Advanced Technology Attachment (SATA), Serial Attached SCSI (SAS), and PCI Express (PCIe) (trademark).

The NAND interface circuit 26 is connected to the memory device MD and controls transfer of data, commands, and addresses between the memory device MD and the memory controller 20. The connection between the NAND interface circuit 26 and the memory device MD supports a NAND interface standard. For example, the NAND interface circuit 26 includes channels CH0 to CH3 that can be controlled in parallel. The channel CH0 is connected to the memory devices MD0, MD4, MD8, and MD12, the channel CH1 is connected to the memory devices MD1, MD5, MD9, and MD13, the channel CH2 is connected to the memory devices MD2, MD6, MD10, and MD14, and the channel CH3 is connected to the memory devices MD3, MD7, MD11, and MD15.

In this specification, a set of the plurality of memory devices MD controlled in parallel is referred to as a "bank". In this example, the memory set 10 includes four banks B0 to B3. The bank B0 includes the memory devices MD0 to MD3, the bank B1 includes the memory devices MD4 to MD7, the bank B2 includes the memory devices MD8 to MD11, and the bank B3 includes the memory devices MD12 to MD15. The plurality of memory devices MD connected to a common channel CH can operate in parallel except for operations involving communication between the memory device MD and the NAND interface circuit 26. The number of the memory devices MD included in the memory set 10 and configurations of the bank and the channel can be freely designed.

[1-1-2] Configuration of Memory Device MD

FIG. 2 shows an example of a configuration of the memory device MD according to the first embodiment. As shown in FIG. 2, the memory device MD includes, for example, an input/output circuit 101, a register set 102, a logic control circuit 103, a sequencer 104, a ready/busy control circuit 105, a driver circuit 106, a memory cell array 107, a row decoder module 108, a sense amplifier module 109, and a counter 110.

The input/output circuit 101 transmits and receives input/output signals I/O0 to I/O7 of, for example, 8-bit width to and from the memory controller 20. The input/output signal I/O may include data, status information, address information, command, and the like. The input/output circuit 101 transmits and receives data DAT to and from the sense amplifier module 109.

The register set 102 includes a status register 102A, an address register 102B, and a command register 102C. The status register 102A, the address register 102B, and the command register 102C hold status information STS, address information ADD, and a command CMD, respectively. The status information STS is transferred from the status register 102A to the input/output circuit 101 based on an instruction from the memory controller 20, and is output to the memory controller 20. The address information ADD is transferred from the input/output circuit 101 to the address register 102B and may include a block address, a page address, a column address, and the like. The command CMD is transferred from the input/output circuit 101 to the command register 102C, and includes commands related to various operations of the memory device MD.

The logic control circuit 103 controls each of the input/output circuit 101 and the sequencer 104 based on a control signal received from the memory controller 20. As such a control signal, for example, a chip enable signal CEn, a command latch enable signal CLE, an address latch enable signal ALE, a write enable signal WEn, a read enable signal REn, and a write protect signal WPn are used. The chip enable signal CEn is a signal that enables the memory device MD. The command latch enable signal CLE is a signal that notifies the input/output circuit 101 that the received input/output signal I/O is the command CMD. The address latch enable signal ALE is a signal that notifies the input/output circuit 101 that the received input/output signal I/O is the address information ADD. The write enable signal WEn is a signal that instructs the input/output circuit 101 to input the input/output signal I/O. The read enable signal REn is a signal that instructs the input/output circuit 101 to output the input/output signal I/O. The write protect signal WPn is a signal that places the memory device MD in a protected state when a power supply is turned on and off.

The sequencer 104 controls the overall operation of the memory device MD. For example, the sequencer 104 executes read operation, write operation, erase operation, and the like based on the command CMD held in the command register 102C and the address information ADD held in the address register 102B. In addition, the sequencer 104 updates the status information STS in the status register 102A based on the operation and state of the memory device MD.

The ready/busy control circuit 105 generates a ready/busy signal RBn based on an operation state of the sequencer 104. The ready/busy signal RBn is a signal that notifies the memory controller 20 whether the memory device MD is in a ready state or a busy state. In this specification, the "ready state" indicates that the memory device MD is in a state of accepting an instruction from the memory controller 20, and the "busy state" indicates that the memory device MD is in a state of not accepting the instruction from the memory controller 20.

The driver circuit 106 generates a voltage used in the read operation, the write operation, the erase operation, and the like. Then, the driver circuit 106 supplies the generated voltage to the memory cell array 107, the row decoder module 108, the sense amplifier module 109, and the like.

The memory cell array 107 includes a plurality of blocks BLK0 to BLKn (n is an integer of 1 or more). The block BLK is a set of a plurality of memory cell transistors capable of storing data nonvolatilely. The block BLK is used, for example, as a data erasing unit. Furthermore, the memory cell array 107 is provided with a plurality of bit lines BL0 to BLm (m is an integer of 1 or more), a plurality of word lines, source lines, and well lines. Each memory cell transistor is associated with a bit line BL and a word line.

The row decoder module 108 selects the block BLK to be operated based on the block address. Then, the row decoder module 108 transfers the voltage supplied from the driver circuit 106 to various wires in the selected block BLK. Furthermore, the row decoder module 108 includes a plurality of row decoders RD0 to RDn. The row decoders RD0 to RDn are associated with the blocks BLK0 to BLKn, respectively.

During the read operation, the sense amplifier module 109 reads the data from the memory cell array 107 and transfers the read data to the input/output circuit 101. During the write operation, the sense amplifier module 109 applies a desired voltage to the bit line BL based on the data received from the input/output circuit 101. For example, the sense amplifier module 109 includes a plurality of sense amplifier units SAU0 to SAUm. The sense amplifier units SAU0 to SAUm are associated respectively with the bit lines BL0 to BLm.

The counter 110 counts, for example, the number of "1" data or the number of "0" data transferred from the sense amplifier module 109. Then, the counter 110 transfers the count result to the sequencer 104. The counter 110 is used, for example, to determine a verify pass during the write operation. Furthermore, the counter 110 is used for defect detection/read operation described later, and is also used for determining the presence/absence of a defect in the word line.

[1-1-3] Circuit Configuration of Memory Device MD (Circuit Configuration of Memory Cell Array 107)

Figure 3:
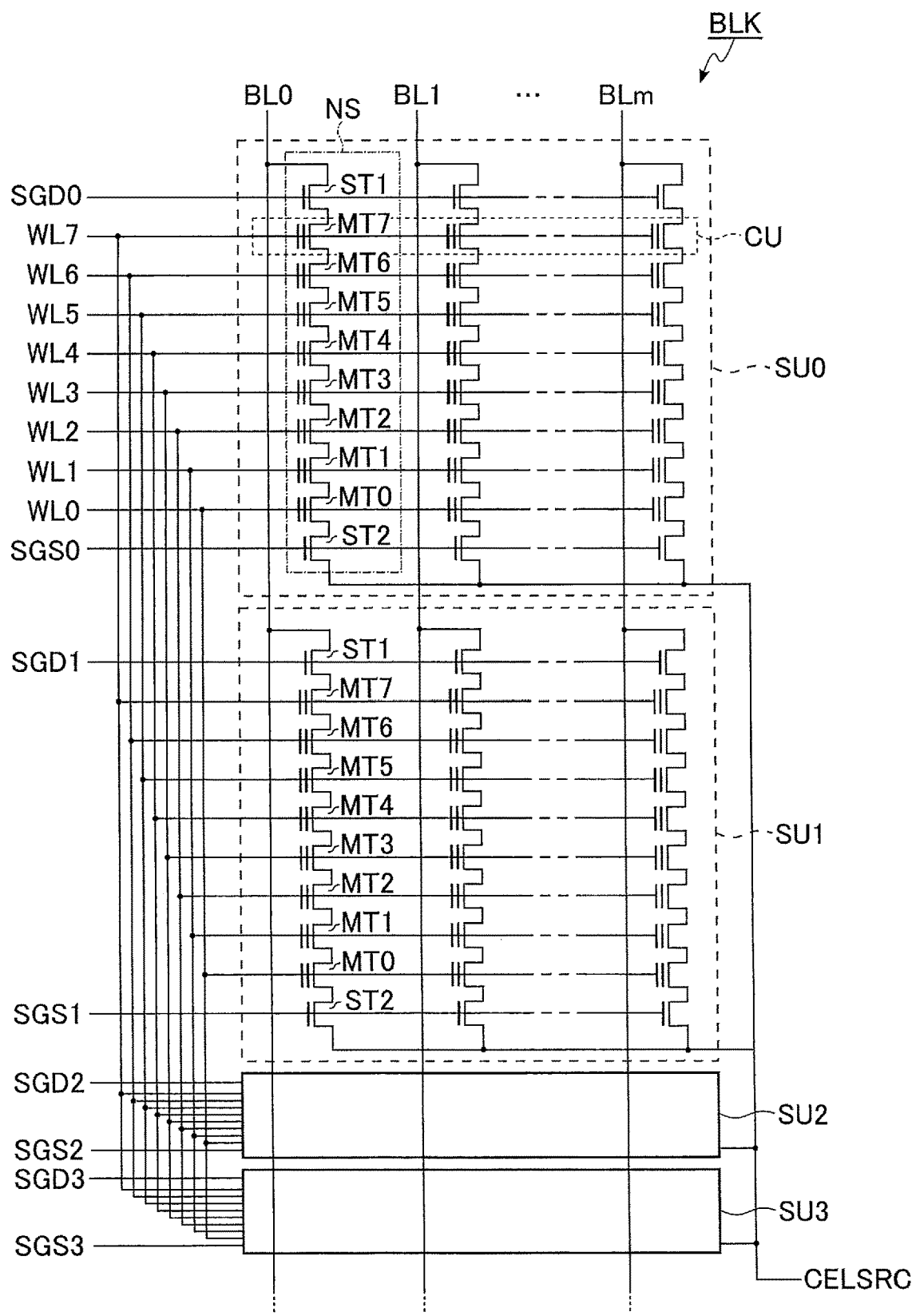
FIG. 3 is a circuit diagram showing an example of a circuit configuration of a memory cell array included in the memory device according to the first embodiment.

FIG. 3 shows an example of a circuit configuration of the memory cell array 107 included in the memory device MD according to the first embodiment, and displays one of the plurality of blocks BLK included in the memory cell array 107. The block BLK includes, for example, four string units SU0 to SU3, as shown in FIG. 3.

Each of the string units SU includes a plurality of NAND strings NS associated with the bit lines BL0 to BLm (m is an integer of 1 or more), respectively. Each of the NAND strings NS includes, for example, memory cell transistors MT0 to MT7 and select transistors ST1 and ST2. The memory cell transistor MT includes a control gate and a charge accumulation layer and nonvolatilely stores data. Each of the select transistors ST1 and ST2 is used for selecting the string unit SU during various operations.

In each of the NAND strings NS, the memory cell transistors MT0 to MT7 are connected in series. A drain of the select transistor ST1 is connected to the associated bit line BL. A source of the select transistor ST1 is connected to one end of the memory cell transistors MT0 to MT7 connected in series. A drain of the select transistor ST2 is connected to the other end of the memory cell transistors MT0 to MT7 connected in series. A source of the select transistor ST2 is connected to a source line CELSRC.

Control gates of the memory cell transistors MT0 to MT7 in the same block BLK are coupled to the word lines WL0 to WL7, respectively. The plurality of select transistors ST1 and ST2 in the string unit SU0 are connected to select gate lines SGD0 and SGS0; respectively. The plurality of select transistors ST1 and ST2 in the string unit SU1 are connected to select gate lines SGD1 and SGS1, respectively. The plurality of select transistors ST1 and ST2 in the string unit SU2 are connected to select gate lines SGD2 and SGS2, respectively. The plurality of select transistors ST1 and ST2 in the string unit SU3 are connected to select gate lines SGD3 and SGS3, respectively. The bit line BL is shared by the NAND string NS assigned the same column address. A source line CELSRC is shared between, for example, the plurality of blocks BLK.

In this specification, a group of the memory cell transistors MT connected to the common word line WL in the single string unit SU is referred to as a "cell unit CU". For example, the storage capacity of the cell unit CU including the plurality of memory cell transistors MT each storing 1 bit data is defined as "one page data". The cell unit CU may have a storage capacity of two or more page data according to the number of bits of data stored in one memory cell transistor MT.

The circuit configuration of the memory cell array 107 included in the memory device MD according to the first embodiment is not limited to the configuration described above. For example, the number of the string units SU included in each of the blocks BLK and the number of the memory cell transistors MT and the select transistors ST1 and ST2 included in each of the NAND strings NS may be any number. The select gate line SGS may be separated for each of the string units SU. The NAND string NS may include a dummy memory cell transistor.

(Circuit Configuration of Sense Amplifier Module 109)

FIG. 4 shows an example of a circuit configuration of the sense amplifier unit SAU included in the sense amplifier module 109 included in the memory device MD according to the first embodiment. As shown in FIG. 4, the sense amplifier unit SAU includes, for example, a bit line connection unit BLHU, a sense amplifier part SA, a latch circuit SDL, ADL, BDL, CDL, DDL, and XDL, and a bus LBUS.

The sense amplifier part SA includes transistors T0 to T7 and a capacitor CP. The bit line connection unit BLHU includes a transistor T8. The latch circuit SDL includes inverters IV0 and IV1, and transistors T10 and T11. The transistor T0 is a P-type MOS transistor. Each of the transistors T1 to T7, T10, and T11 is an N-type MOS transistor. The transistor T8 is an N-type MOS transistor having a higher withstand voltage than each of the transistors T0 to T7.

A source of the transistor T0 is connected to a power supply line. A drain of the transistor T0 is connected to a node ND1. A gate of the transistor T0 is connected to a node SINV in the latch circuit SDL. A drain of the transistor T1 is connected to the node ND1. A source of the transistor T1 is connected to a node ND2. A control signal BLX is input to a gate of the transistor T1. A drain of the transistor T2 is connected to the node ND1. A source of the transistor T2 is connected to a node SEN. A control signal HLL is input to a gate of the transistor T2.

A drain of the transistor T3 is connected to the node SEN. A source of the transistor T3 is connected to the node ND2. A control signal XXL is input to a gate of the transistor T3. A drain of the transistor T4 is connected to the node ND2. A control signal BLC is input to a gate of the transistor T4. A drain of the transistor T5 is connected to the node ND2. A source of the transistor T5 is connected to a node SRC. A gate of the transistor T5 is connected to a node SINV in the latch circuit SDL, for example.

A source of the transistor T6 is grounded. A gate of the transistor T6 is connected to the node SEN. A drain of the transistor T7 is connected to the bus LBUS. A source of the transistor T7 is connected to a drain of the transistor T6. A control signal STB is input to a gate of the transistor T7. One electrode of the capacitor CP is connected to the node SEN. A clock signal CLK is input to the other electrode of the capacitor CP. A drain of the transistor T8 is connected to a source of the transistor T4. A source of the transistor T8 is connected to the associated bit line BL. A control signal BLS is input to a gate of the transistor T8.

An input node of the inverter IV0 is connected to a node SLAT. An output node of the inverter IV0 is connected to the node SINV. An input node of the inverter IV1 is connected to the node SINV. An output node of the inverter IV1 is connected to the node SLAT. One end of the transistor T10 is connected to the node SINV. The other end of the transistor T10 is connected to the bus LBUS. A control signal STI is input to a gate of the transistor T10. One end of the transistor T11 is connected to the node SLAT. The other end of the transistor T11 is connected to the bus LBUS. The control signal STL is input to a gate of the transistor T11. For example, data stored in the node SLAT corresponds to data stored in the latch circuit SDL. On the other hand, data stored in the node SINV corresponds to inverted data of the data stored in the node SLAT.

The circuit configuration of the latch circuits ADL, BDL, CDL, DDL, and XDL is the same as the circuit configuration of the latch circuit SDL, for example. For example, the latch circuit ADL stores data in a node ALAT and stores its inverted data in a node AINV. Then, a control signal ATI is input to the gate of the transistor T10 of the latch circuit ADL, and a control signal ATL is input to the gate of the transistor T11 of the latch circuit ADL. The latch circuit BDL stores data in a node BLAT and stores its inverted data in a node BINV. Then, a control signal BTI is input to the gate of the transistor T10 of the latch circuit BDL, and a control signal BTL is input to the gate of the transistor T11 of the latch circuit BDL. Since the same applies to the latch circuits CDL, DDL, and XDL, the description thereof will be omitted.

In the circuit configuration of the sense amplifier unit SAU described above, for example, a power supply voltage VDD is applied to the power supply line connected to the source of the transistor T0. For example, a ground voltage VSS is applied to the node SRC. Each of the control signals BLX, HLL, XXL, BLC, STB, BLS, STI, and STL, and the clock signal CLK is generated by the sequencer 14, for example. The node SEN may be called a sense node of the sense amplifier part SA. For example, when the control signal STB is asserted during the read operation, the sense amplifier part SA determines whether the read data is "0" or "1" based on the voltage of the associated bit line BL. In other words, the sense amplifier part SA senses the read data on the corresponding bit line BL and determines data to be stored in the selected memory cell. In this example, asserting the control signal corresponds to temporarily changing an "L" level voltage to an "H" level voltage.

The sense amplifier part SA and the latch circuits SDL, ADL, BDL, CDL, DDL, and XDL are commonly connected to the bus LBUS. The latch circuits SDL, ADL, BDL, CDL, DDL, and XDL can transmit and receive data to and from each other via the bus LBUS. Each of the latch circuits SDL, ADL, BDL, and XDL temporarily stores read data, write data, and the like. The latch circuit XDL is used in input and output of data between the sense amplifier unit SAU and the input/output circuit 101. The latch circuit XDL may also be used as a cache memory of the memory device, for example. The memory device MD can transition to the ready state at least if the latch circuit XDL is free. The latch circuit XDL can also transfer data to the counter 110.

The circuit configuration of the sense amplifier module 109 included in the memory device MD according to the first embodiment is not limited to the configuration described above. For example, the number of latch circuits included in each of the sense amplifier units SAU can be appropriately changed based on the number of pages stored in one cell unit CU. The sense amplifier unit SAU may include an arithmetic circuit capable of executing a simple logical operation. When the transistor whose gate is connected to the sense node is a P-type transistor, asserting the control signal STB can correspond to temporarily changing the "H" level voltage to the "L" level voltage.

[1-1-4] Data Storage Method

The memory system 1 according to the first embodiment can use a plurality of types of write modes according to the number of bits of data stored in one memory cell transistor MT. For example, the memory system 1 according to the first embodiment uses at least one write mode of a single-level cell (SLC) mode, a multi-level cell (MLC) mode, a triple-level cell (TLC) mode, and a quadruple-level cell (QLC) mode. The SLC mode, the MLC mode, the TLC mode, and the QLC mode are write modes in which 1-bit data, 2-bit data, 3-bit data, and 4-bit data are stored in one memory cell transistor MT, respectively.

FIG. 5 is an example of a distribution of a threshold voltage of the memory cell transistor MT in the memory system 1 according to the first embodiment, and shows a group of four types of threshold voltage distributions corresponding to the SLC mode, the MLC mode, the TLC mode, and the QLC mode, respectively and a read voltage. "NMTs" on the vertical axis indicates the number of the memory cell transistors MT. "Vth" on the horizontal axis indicates the threshold voltage of the memory cell transistor MT. As shown in FIG. 5, the plurality of memory cell transistors MT form a plurality of threshold voltage distributions according to the applied write mode, that is, the number of bits of data to be stored.

When the SLC mode (1 bit/cell) is used, two states are formed by the threshold voltages of the plurality of memory cell transistors MT. These two states are called "S0" state and "S1" state, respectively, in order from the lowest threshold voltage, for example. In the SLC mode, different 1-bit data are assigned to the respective "S0" and "S1" states.

When the MLC mode (2 bits/cell) is used, four states are formed by the threshold voltages of the plurality of memory cell transistors MT. These four states are called "S0" state, "S1" state, "S2" state, and "S3" state, respectively, in order from the lowest threshold voltage, for example. In the MLC mode, different 2-bit data are assigned to the respective "S0" to "S3" states.

When the TLC mode (3 bits/cell) is used, eight states are formed by the threshold voltages of the plurality of memory cell transistors MT. These eight states are called "S0" state, "S1" state, "S2" state, "S3" state, "S4" state, "S5" state, "S6" state, and "S7" state, respectively, in order from the lowest threshold voltage, for example. In the TLC mode, different 3-bit data are assigned to the respective "S0" to "S7" states.

When the QLC mode (4 bits/cell) is used, sixteen states are formed by the threshold voltages of the plurality of memory cell transistors MT. These sixteen states are called "S0" state, "S1" state, "S2" state, "S3" state, "S4" state, "S5" state, "S6" state, "S7" state, "S8" state, "S9" state, "S10" state, "S11" state, "S12" state, "S13" state, "S14" state, and "S15" state, respectively, in order from the lowest threshold voltage, for example. In the QLC mode, different 4-bit data are assigned to the respective "S0" to "S15" states.

In each write mode, the read voltage is set independently between the adjacent states. Specifically, the read voltage R1 is set between the "S0" and "S1" states. The read voltage R2 is set between the "S1" and "S2" states. The read voltage R3 is set between the "S2" and "S3" states. The read voltage R4 is set between the "S3" and "S4" states. The read voltage R5 is set between the "S4" and "S5" states. The read voltage R6 is set between the "S5" and "S6" states. The read voltage R7 is set between the "S6" and "S7" states. The read voltage R8 is set between the "S7" and "S8" states. The read voltage R9 is set between the "S8" and "S9" states. The read voltage R10 is set between the "S9" and "S10" states. The read voltage R11 is set between the "S10" and "S11" states. The read voltage R12 is set between the "S11" and "S12" states. The read voltage R13 is set between the "S12" and "S13" states. The read voltage R14 is set between the "S13" and "S14" states. The read voltage R15 is set between the "S14" and "S15" states.

In each write mode, a read pass voltage VREAD is set to a voltage higher than the state with the highest threshold voltage. The memory cell transistor MT in which the read pass voltage VREAD is applied to the gate is retained in an on state regardless of stored data. In each write mode, verify voltages are respectively set between adjacent threshold distributions. Specifically, in the write operation, verify voltages V1 to V15 are used for respective verify operations in the "S1" to "S15" states. For example, the verify voltages V1 to V15 are set to higher voltages than the read voltages R1 to R15, respectively.

Figure 6:
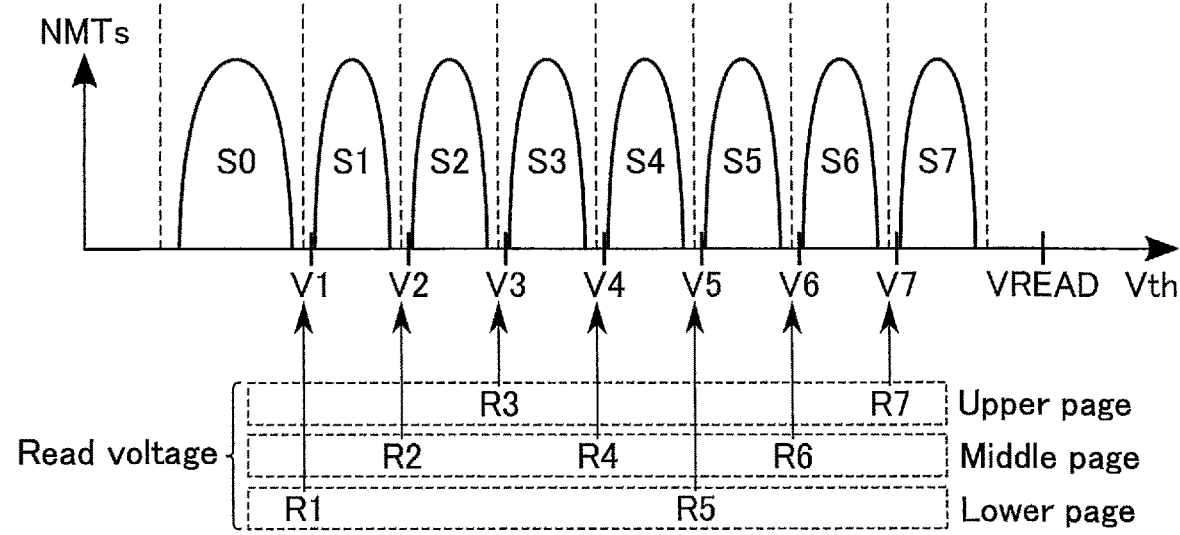
FIG. 6 is a schematic diagram showing an example of data assignment in a TLC mode used in the memory system according to the first embodiment.

FIG. 6 shows an example of data assignment in the TLC mode used in the memory system 1 according to the first embodiment. As shown in FIG. 6, in the TLC mode, different 3-bit data are assigned to the respective eight states. Below is an example of data assignment for the eight states.

"S0" state: "111 (high order bit/middle order bit/low order bit)" data
"S1" state: "110" data
"S2" state: "100" data
"S3" state: "000" data
"S4" state: "010" data
"S5" state: "011" data
"S6" state: "001" data
"S7" state: "101" data When the data assignment shown in FIG. 6 is applied in the TLC mode, one page data (lower page data) including low order bits is determined by read operation using the read voltages R1 and R5. One page data (middle page data) including middle order bits is determined by read operation using the read voltages R2, R4, and R6. One page data (upper page data) including upper order bits is determined by read operation using the read voltages R3 and R7. In page read operation in which a plurality of read voltages are used, arithmetic processing is appropriately executed in the sense amplifier unit SAU.

The write mode used by the memory system 1 described above is only an example. Data of five or more bits may be stored in each of the memory cell transistors MT. The read voltage, the read pass voltage, and the verify voltage may be set to the same voltage value in each write mode, or may be set to different voltage values. The data assignment used in the TLC mode is not limited to the assignment shown in FIG. 6. The data assignment in each write mode can be freely designed.

[1-2] Operation

Next, an operation of the memory device MD according to the first embodiment will be described. In the following description, the selected word line WL is referred to as WLsel, and the unselected word line WL is referred to as WLusel. Applying a voltage to the word line WL corresponds to applying a voltage to this word line WL by the driver circuit 106 via the row decoder module 108. The address information ADD and the command CMD received by the memory device MD are transferred to the address register 102B and the command register 102C, respectively. The write data received by the memory device MD is transferred to the latch circuit XDL in each of the sense amplifier units SAU included in the sense amplifier module 109.

[1-2-1] Outline of Write Operation

The memory device MD according to the first embodiment can use a plurality of write modes properly in the write operation. The plurality of write modes include at least a normal mode and a defect detection mode. In the write operation in the defect detection mode, after data is written, defect detection reading and comparison processing is executed. The defect detection reading and comparison processing is an operation of confirming whether the written data is correctly stored. On the other hand, the write operation in the normal mode corresponds to the write operation in which the defect detection reading and comparison processing is omitted with respect to the defect detection mode. The details of the write operation in the normal mode and the write operation in the defect detection mode will be described later.

Figure 7:
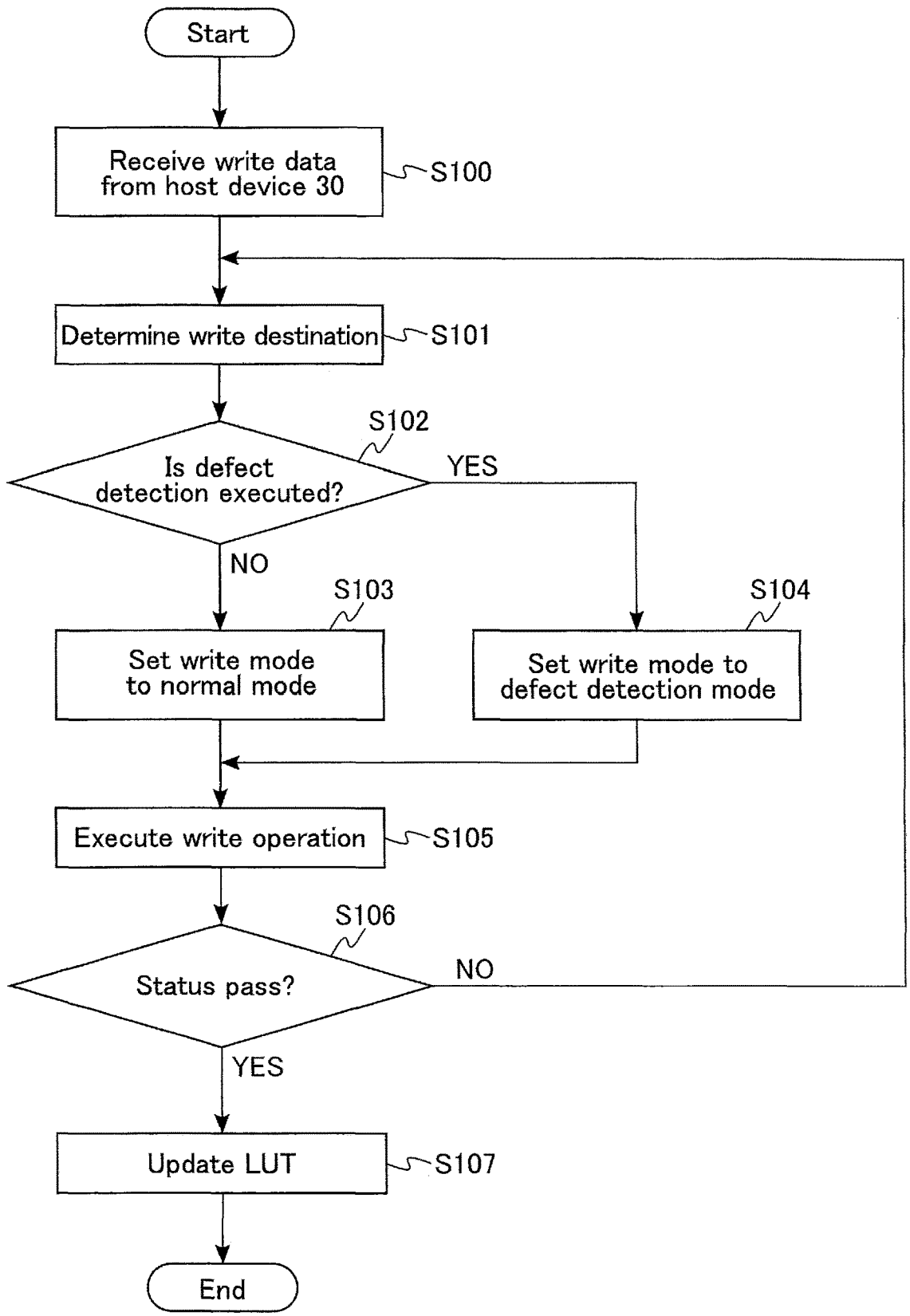
FIG. 7 is a flowchart showing an example of a write operation in the memory system according to the first embodiment.

FIG. 7 shows an example of the flow of the write operation of the memory system 1 according to the first embodiment. As shown in FIG. 7, the memory controller 20 first receives the write data from the host device 30 (step S100). Then, the memory controller 20 stores the received write data in the RAM 23. Subsequently, the memory controller 20 determines a write destination of the received write data (step S101). In the determination of the write destination, for example, a management table of the storage region expanded in the RAM 23 is referred to.

Next, the memory controller 20 confirms whether or not to execute defect detection (step S102). If no defect detection is executed (step S102, NO), the memory controller 20 sets the write mode to the normal mode (step S103). On the other hand, if the defect detection is executed (step S102, YES), the memory controller 20 sets the write mode to the defect detection mode (step S104). After step S103 or S104, the memory controller 20 transfers the write data to the memory device MD and instructs the memory device MD to execute the write operation according to the set write mode.

When the write operation of the memory device MD is completed, the memory controller 20 reads the status information from the memory device MD and confirms whether or not the status of the write operation is a pass (step S106). If the status is not the pass (step S106, NO), the memory controller 20 returns to the process of step S101, changes the write destination, and executes the write operation. On the other hand, if the status is the pass (step S106, YES), the memory controller 20 updates the lookup table LUT based on the address to which the write data received from the host device 30 is written (step S107). After that, the memory controller 20 discards the write data stored in the RAM 23 and terminates the write operation of the write data.

[1-2-2] Write Operation in Normal Node

The write operation in the normal mode in the memory system 1 according to the first embodiment will be described below by taking as an example a case where the TLC mode (3 bits/cell) is applied to a data storage method.

(Command Sequence of Write Operation in Normal Mode)

Figures 8, 9:
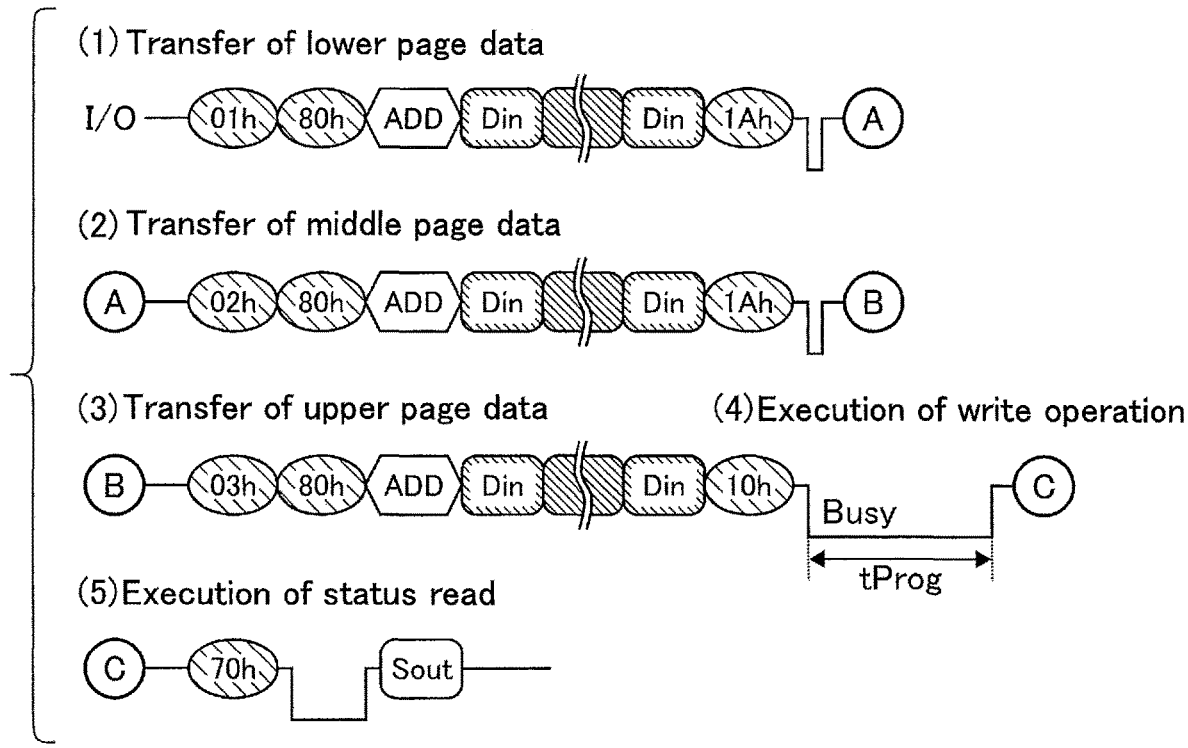
FIG. 8 is a schematic diagram showing an example of a command sequence of the write operation in a normal mode in the memory system according to the first embodiment.
FIG. 9 is a table showing an example of status information in the write operation in the normal mode in the memory device according to the first embodiment.

FIG. 8 shows an example of a command sequence of the write operation in the normal mode of the memory system 1 according to the first embodiment, and displays communication of the input/output signal I/O between the memory controller 20 and the memory device MD. The memory system 1 sequentially executes the operations of (1) to (5) of FIG. 8 described in detail below in the write operation in the normal mode.

First, as shown in (1) of FIG. 8, the memory controller 20 transfers a command set, including data of a first page (lower page data in the TLC mode) of three page data assigned to the cell unit CU to be written, to the memory device MD. Specifically, the memory controller 20 transmits a command "01h", a command "80h", the address information "ADD", write data "Din" of the lower page, and a command "1Ah" to the memory device MD in this order. The command "01h" is a command that gives an instruction on operation corresponding to the data of the first page. The command "80h" is a command that gives an instruction on the write operation. The address information "ADD" includes an address assigned to the cell unit CU to be written. The command "1Ah" is a command that gives an instruction on transfer of data stored in the latch circuit XDL to the other latch circuits. When the memory device MD receives the command "1Ah", the memory device MD temporarily transitions to the busy state and transfers the lower page data from the latch circuit XDL to, for example, the latch circuit ADL.

Next, as shown in (2) of FIG. 8, the memory controller 20 transfers a command set, including data of a second page (middle page data in the TLC mode) of the three page data assigned to the cell unit CU to be written, to the memory device MD. Specifically, the memory controller 20 transmits a command "02h", the command "80h", the address information "ADD", the write data "Din" of the middle page, and the command "1Ah" to the memory device MD in this order. The command "02h" is a command that gives an instruction on operation corresponding to the data of the second page. When the memory device MD receives the command "1Ah", the memory device MD temporarily transitions to the busy state and transfers the middle page data from the latch circuit XDL to, for example, the latch circuit BDL.

Next, as shown in (3) of FIG. 8, the memory controller 20 transfers a command set, including data of a third page (upper page data in the TLC mode) of the three page data assigned to the cell unit CU to be written, to the memory device MD. Specifically, the memory controller 20 transmits a command "03h", the command "80h", the address information "ADD", the write data "Din" of the upper page, and a command "10h" to the memory device MD in this order. The command "03h" is a command that gives an instruction on operation corresponding to the data of the third page. The command "10h" is a command that gives an instruction to start the write operation after the upper page data stored in the latch circuit XDL is transferred to the latch circuit CDL, for example.

When the memory device MD receives the command "10h", the memory device MD transitions from the ready state (RBn="H" level) to the busy state (RBn="L" level) as shown in (4) of FIG. 8. Then, the memory device MD executes the write operation in the normal mode using, for example, the 3-bit data stored in the latch circuits ADL, BDL, and CDL. When the write operation is completed, the memory device MD transitions from the busy state to the ready state and notifies the memory controller 20 of the completion of the write operation. The illustrated "tProg" corresponds to the time during which the memory device MD executes the write operation.

When the write operation is completed and the memory device MD transitions from the busy state to the ready state, the memory controller 20 executes a status read as shown in (5) of FIG. 8. Specifically, the memory controller 20 transmits a command "70h" to the memory device MD. The memory device MD having received the command "70h" transmits status information "Sout" stored in the status register 102A to the memory controller 20. This status information "Sout" includes the status information STS of the write operation executed immediately before. Then, the memory controller 20 refers to the status information "Sout" and confirms the status of the write operation (step S106 in FIG. 7).

(Status Information STS in Write Operation in Normal Mode)

FIG. 9 shows an example of the status information STS in the write operation in the normal mode in the memory device MD according to the first embodiment. As shown in FIG. 9, the status information STS read after the write operation in the normal mode includes, for example, data indicating a program fail (Loop Max). The data indicating the program fail (Loop Max) is stored in, for example, I/O0. For example, data "0" of I/O0 indicates that the write operation is completed normally. Data "1" of I/O0 indicates that the writing has not been completed in a program loop performed a predetermined number of times.

The status information STS includes, for example, data (True busyn) indicating whether or not the memory device MD is executing an operation, data indicating whether or not a cache is free (Cache busyn), and a write protect signal WPn. For example, True busyn, Cache busyn, and WPn are stored in I/O5, I/O6, and I/O7, respectively. The status information STS read after the write operation in the normal mode may include at least the data indicating the program fail (Loop Max).

In the write operation in the normal mode, the memory controller 20 determines the write operation as a status pass when the data "0" is stored in I/O0 (program fail (Loop Max)) included in the status information STS (step S106 in FIG. 7: YES). On the other hand, when the data "1" is stored in I/O0 included in the status information STS, the memory controller 20 determines that the write operation is not the status pass, that is, a status fail (step S106 in FIG. 7: NO).

(Flow of Write Operation in Normal Mode)

Figure 10:
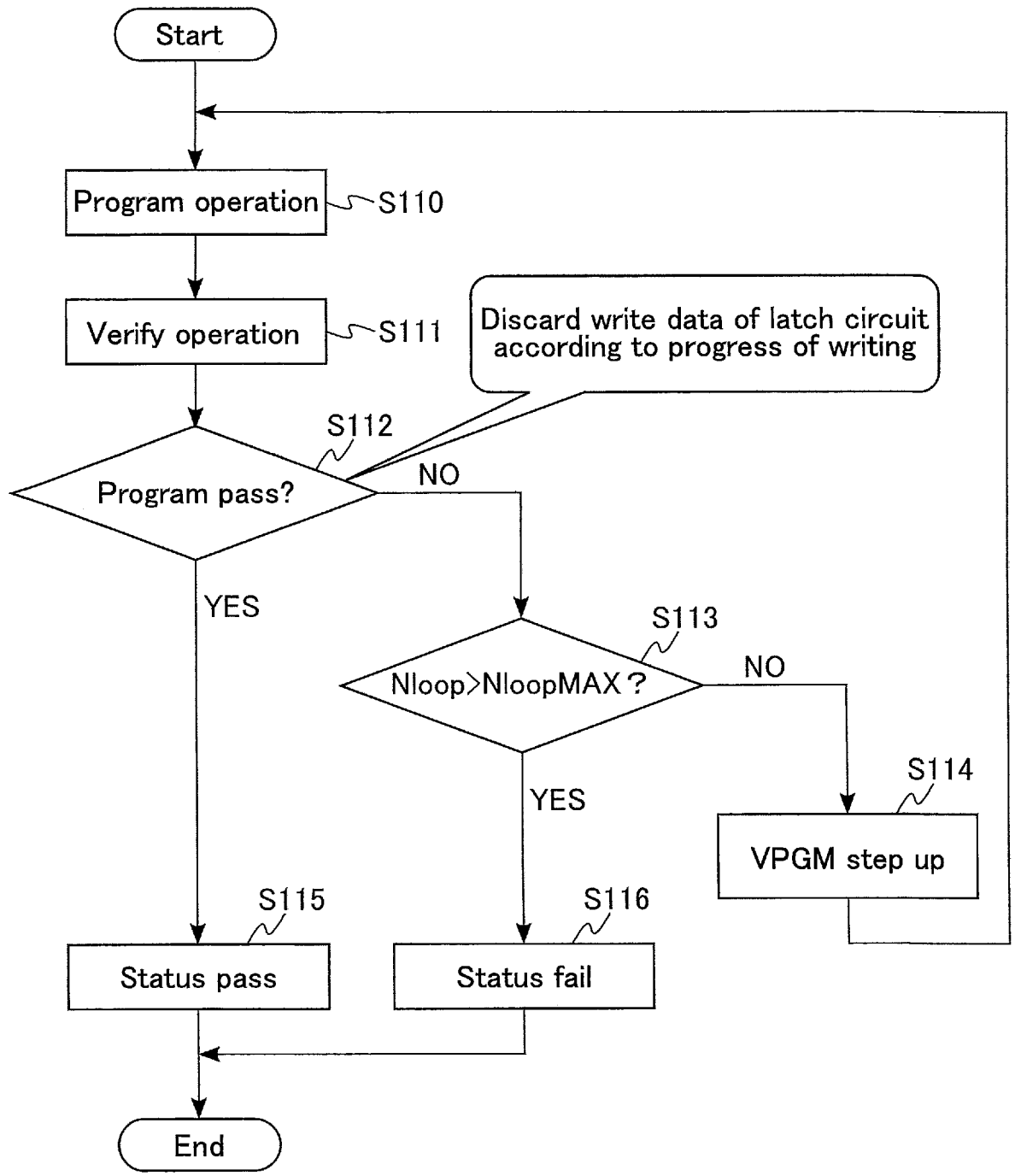
FIG. 10 is a flowchart showing an example of the write operation in the normal mode in the memory device according to the first embodiment.

FIG. 10 shows an example of a flow of the write operation in the normal mode in the memory device MD according to the first embodiment. The flow of the write operation in the normal mode in the memory device MD will be described below with reference to FIG. 10.

First, the sequencer 104 executes a program operation (step S110). The program operation is an operation of applying a program voltage to the memory cell transistor MT to be written. In the program operation, the memory cell transistor MT in the selected cell unit CU is set to a program target or a program inhibition based on the write data stored in the sense amplifier unit SAU. In the memory cell transistor MT to be programmed, the threshold voltage rises due to the program operation. On the other hand, in the program-inhibited memory cell transistor MT, the increase in the threshold voltage due to the program operation is suppressed.

Next, the sequencer 104 executes the verify operation (step S111). The verify operation is a read operation for determining whether the threshold voltage of the memory cell transistor MT to be written has reached a desired state. In the write operation, a pair of the program operation and the verify operation is executed a plurality of times. In the following, a pair of one program operation and one verify operation is referred to as a "program loop". When the verify operation is completed, a result of the verify operation is transferred to the counter 110. The counter 110 counts the number of the memory cell transistors MT that have not passed verification, for example, for each state.

Next, the sequencer 104 determines whether or not the writing of the state to be verified is completed, that is, whether or not the state is a program pass, based on a count result of the counter 110 (step S112). If the state is not the program pass (step S112, NO), the sequencer 104 confirms whether or not the current number of program loops Nloop exceeds a predetermined number of loops NloopMAX (step S113). If "Nloop>NloopMAX" is not satisfied (step S113, NO), the sequencer 104 steps up a program voltage VPGM (step S114) and returns to the process of step S110, that is, executes the next program loop.

When the program loop is executed repeatedly, the number of latching circuits required to distinguish data in an unwritten state is reduced. Thus, in the write operation in the normal mode, the sequencer 104 appropriately discards data of the latch circuit according to the progress of writing, for example. When the sequencer 104 repeatedly executes the program loop and detects the program pass of all states in the process of step S112 (step S112, YES), the sequencer 104 stores the information on the status pass in the status register 102A and terminates the write operation. On the other hand, when the sequencer 104 detects that the condition of step S112 is not satisfied due to the repetition of the program loop and "loop>NloopMAX" is satisfied in the process of step S113 (step S113, YES), the sequencer 104 stores information on the status fail in the register 102A and terminates the write operation.

(Details of Write Operation in Normal Mode)

Figures 11, 12:
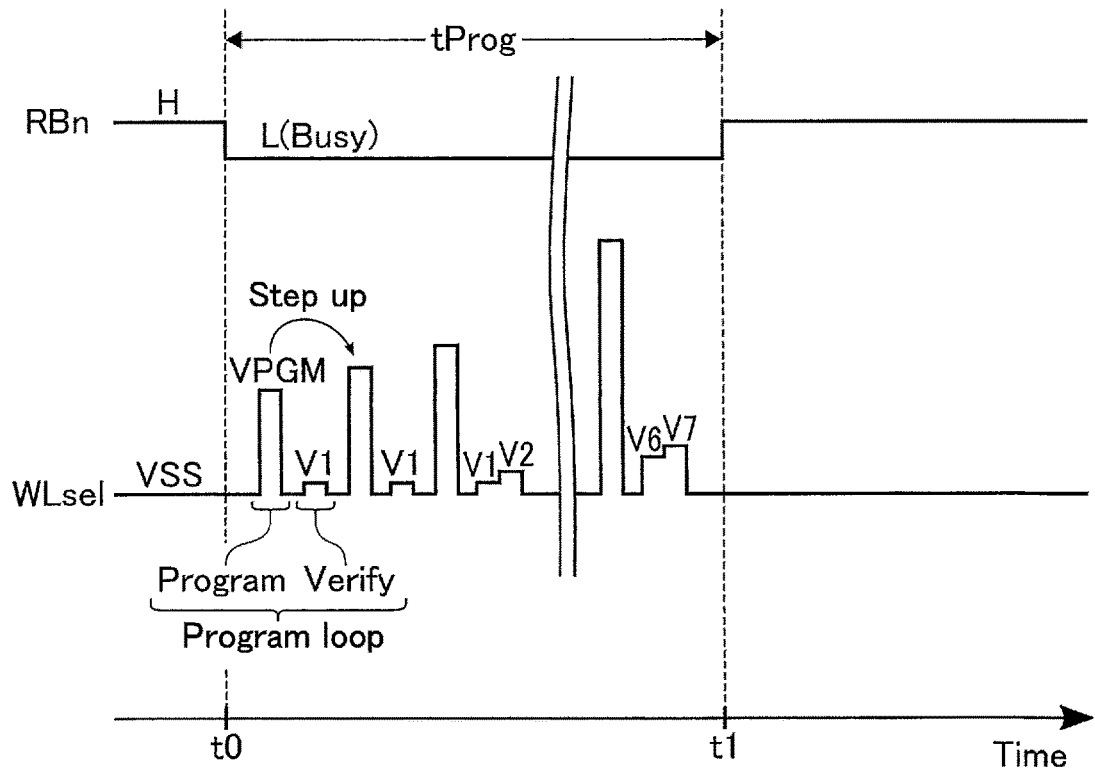
FIG. 11 is a timing chart showing an example of the write operation in the normal mode in the memory device according to the first embodiment.
FIG. 12 is a table showing an example of a method of using a latch circuit in the write operation in the normal mode in the memory device according to the first embodiment.

FIG. 11 shows an example of a timing chart of the write operation in the normal mode in the memory device MD according to the first embodiment and displays the ready/busy signal RBn and a voltage applied to a selected word line WLsel. In an initial state before starting the write operation, the voltage of the selected word line WLsel is, for example, VSS. In FIG. 11, time t0 corresponds to the time at the start of writing, and time t1 corresponds to the time at the end of writing. As shown in FIG. 11, the sequencer 104 executes the program loop including the program operation and the verify operation when the write operation in the normal mode starts.

In the program operation, the program voltage VPGM is applied to the selected word line WLsel. The program voltage VPGM is a high voltage capable of increasing the threshold voltage of the memory cell transistor MT. When the program voltage VPGM is applied to the selected word line WLsel, the threshold voltage of the memory cell transistor MT to be programmed increases. On the other hand, the increase in the threshold voltage of the program-inhibited memory cell transistor MT is suppressed by, for example, self-boost technology.

In the verify operation, the read operation using the verify voltage is executed. In the verify operation, the type and number of verify voltages applied to the selected word line WLsel are appropriately changed according to the progress of the program loop. For example, in the first program loop, the read operation using the verify voltage V1 is executed. The verify voltage used for determining the verify pass is set in each of the sense amplifier units SAU according to the write data to be stored. Then, the memory cell transistor MT that exceeds the set verify voltage is determined to be the verify pass.

The operation described above corresponds to one program loop. The program voltage VPGM is stepped up each time the program loop is repeated and increases with the number of program loops executed. The step-up amount of the program voltage VPGM can be set to any value. Then, when the sequencer 104 repeatedly executes the program loop and detects the program pass of all states, or detects that the number of program loops exceeds a predetermined number of times, the sequencer 104 terminates the write operation and transitions the memory device MD from the busy state to the ready state.

FIG. 12 shows an example of a method of using the latch circuit in the write operation in the normal mode of the memory device MD according to the first embodiment, and displays transition of the data stored by the latch circuit during the write operation corresponding to FIG. 11. As shown in FIG. 12, at the time t0, for example, the latch circuits ADL, BDL, and CDL store the write data of the lower, middle, and upper bits, respectively. At the time t1, the latch circuits ADL, BDL, and CDL store invalid data. That is, in the write operation in the normal mode, the write data stored in the latch circuit in the sense amplifier unit SAU is discarded, for example, when the data writing is terminated.

[1-2-3] Write Operation in Defect Detection Mode

A difference between the write operation in the defect detection mode in the memory system 1 according to the first embodiment and the write operation in the normal mode will be described below by taking as an example the case where the TLC mode (3 bits/cell) is applied to the data storage method.

(Command Sequence of Write Operation in Defect Detection Mode)

Figures 13, 14:
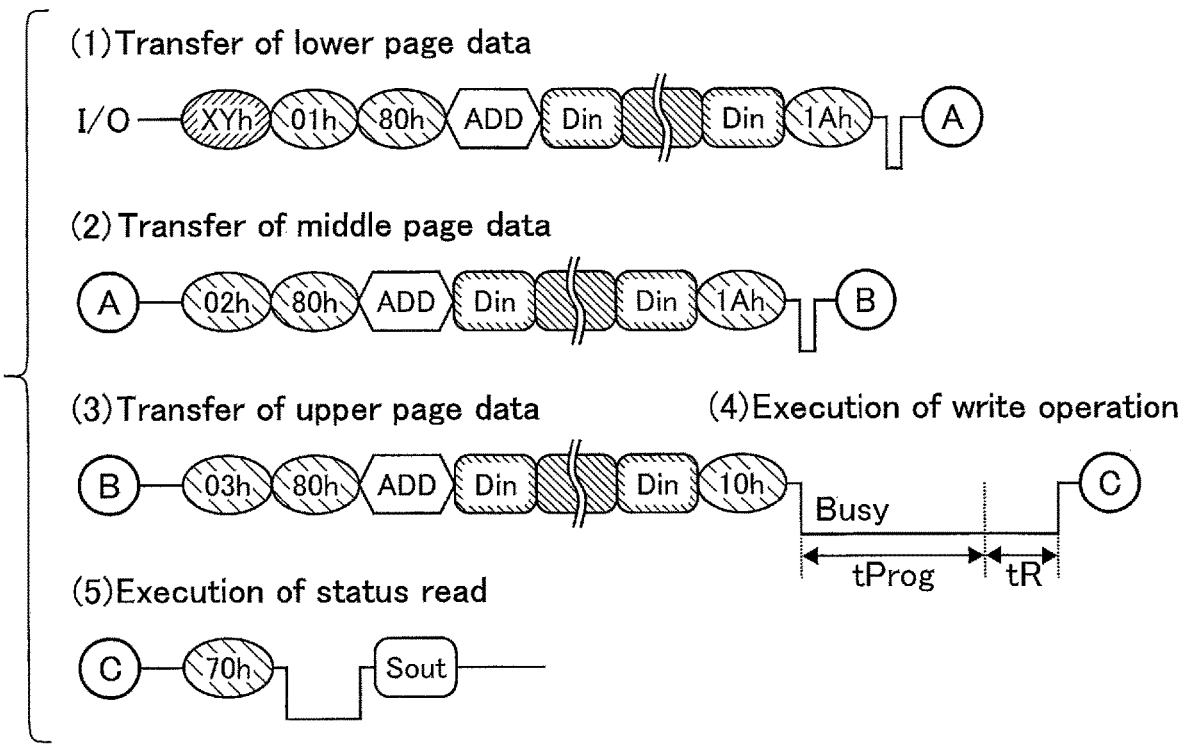
FIG. 13 is a schematic diagram showing an example of a command sequence of the write operation in a defect detection mode in the memory system according to the first embodiment.
FIG. 14 is a table showing an example of the status information in the write operation in the defect detection mode in the memory device according to the first embodiment.

FIG. 13 shows an example of a command sequence of the write operation in the defect detection mode in the memory system 1 according to the first embodiment, and displays communication of the input/output signal I/O between the memory controller 20 and the memory device MD. The memory system 1 sequentially executes the operations of (1) to (5) of FIG. 13 in the write operation in the defect detection mode.

First, as shown in (1) of FIG. 13, the memory controller 20 transfers the lower page data to the memory device MD. Specifically, the memory controller 20 transmits a prefix command "XYh" to the memory device MD. The prefix command "XYh" is a command that gives an instruction on operation corresponding to the defect detection mode. Then, the memory controller 20 transmits a command set including commands, address information, and write data to the memory device MD, as in (1) of FIG. 8 in the write operation in the normal mode.

Next, as shown in (2) and (3) of FIG. 13, the memory controller 20 executes transfer of the middle page data and transfer of the upper page data in this order, as in (2) and (3) of FIG. 8 in the write operation in the normal mode. In the transfer of the upper page data, the memory device MD finally receives the command "10h".

When the memory device MD receives the command "10h", the memory device MD transitions from the ready state to the busy state as shown in (4) of FIG. 13. Then, the memory device MD executes the write operation in the defect detection mode using, for example, the 3-bit data stored in the latch circuits ADL, BDL, and CDL. When the write operation is completed, the memory device MD transitions from the busy state to the ready state and notifies the memory controller 20 of the completion of the write operation. The processing time of the write operation in the defect detection mode includes "tProg" corresponding to a data writing time and "tR" corresponding to the time of the defect detection reading and comparison processing.

When the write operation is completed and the memory device MD transitions from the busy state to the ready state, the memory controller 20 executes the status read similar to the operation in (5) of FIG. 8 in the write operation in the normal mode, as shown in (5) of FIG. 13. The status information "Soot" in the defect detection mode further includes the result of the defect detection reading and comparison processing. Then, the memory controller 20 refers to the status information "Sout" and confirms the status of the write operation (step S106 in FIG. 7).

(Status Information STS in Write Operation in Defect Detection Mode)

FIG. 14 shows an example of the status information STS in the write operation in the defect detection mode in the memory device MD according to the first embodiment. As shown in FIG. 14, the status information STS read after the write operation in the defect detection mode includes, for example, the defect detection results of the lower page, the middle page, and the upper page. For example, the defect detection results of the lower page, the middle page, and the upper page are stored in I/O1, I/O2, and I/O3, respectively. For example, the data "0" of I/O1, I/O2, and I/O3 indicates that no defect has been detected on the lower page, the middle page, and the upper page. The data "1" of I/O1, I/O2, and I/O3 indicates that a defect has been detected on the lower page, the middle page, and the upper page.

The other configurations of the status information STS corresponding to the defect detection mode are the same as those in the normal mode. The status information STS corresponding to the defect detection mode may include at least the defect detection result of a page as a defect detection target. Data indicating the defect detection result can be stored in any I/O. A configuration of the status information STS corresponding to the defect detection mode may change according to the type and number of pages as defect detection targets.

In the write operation in the defect detection mode, the memory controller 20 determines that the write operation is the status pass, for example when the data "0" is stored in all of I/O0 (program fail (Loop Max)), I/O1 (defect detection result of lower page), I/O2 (defect detection result of middle page), and I/O3 (defect detection result of upper page) (step S106 in FIG. 7: YES). On the other hand, the memory controller 20 determines that the write operation is the status fail when the data "1" is stored in at least one of I/O0, I/O1, I/O2, and I/O3 (step S106 in FIG. 7: NO).

(Flow of Write Operation in Defect Detection Mode)

FIG. 15 shows an example of a flow of the write operation in the defect detection mode in the memory device MD according to the first embodiment. As shown in FIG. 15, first, the sequencer 104 executes the processes of steps S110 to S114, that is, the program loop, as in the write operation in the normal mode. The sequencer 104 maintains at least data of the latch circuit corresponding to the page as a defect detection target in the repetition of the program loop in the write operation in the defect detection mode. The write data of other pages may be discarded or maintained according to the progress of the write operation.

When the program loop is repeated and the program pass of all states is detected in the process of step S112 (step S112, YES), the sequencer 104 executes the defect detection reading (step S120) and executes the comparison processing based on the result of the defect detection reading (step S121). Then, the sequencer 104 determines whether or not the number of error bits obtained by the comparison processing exceeds a predetermined reference value N1 (step S122). The reference value N1 can be set to any value according to characteristics of the memory device MD. When "the number of error bits>N1" is not satisfied (step S122, NO), the sequencer 104 proceeds to the process of step S115, stores the information on the status pass in the status register 102A, and terminates the write operation. When "the number of error bits>N1" is satisfied (step S122, YES), the sequencer 104 proceeds to the process of step S116, stores the information on the status fail in the status register 102A, and terminates the write operation.

(Details of Write Operation in Defect Detection Mode)

Figure 16:
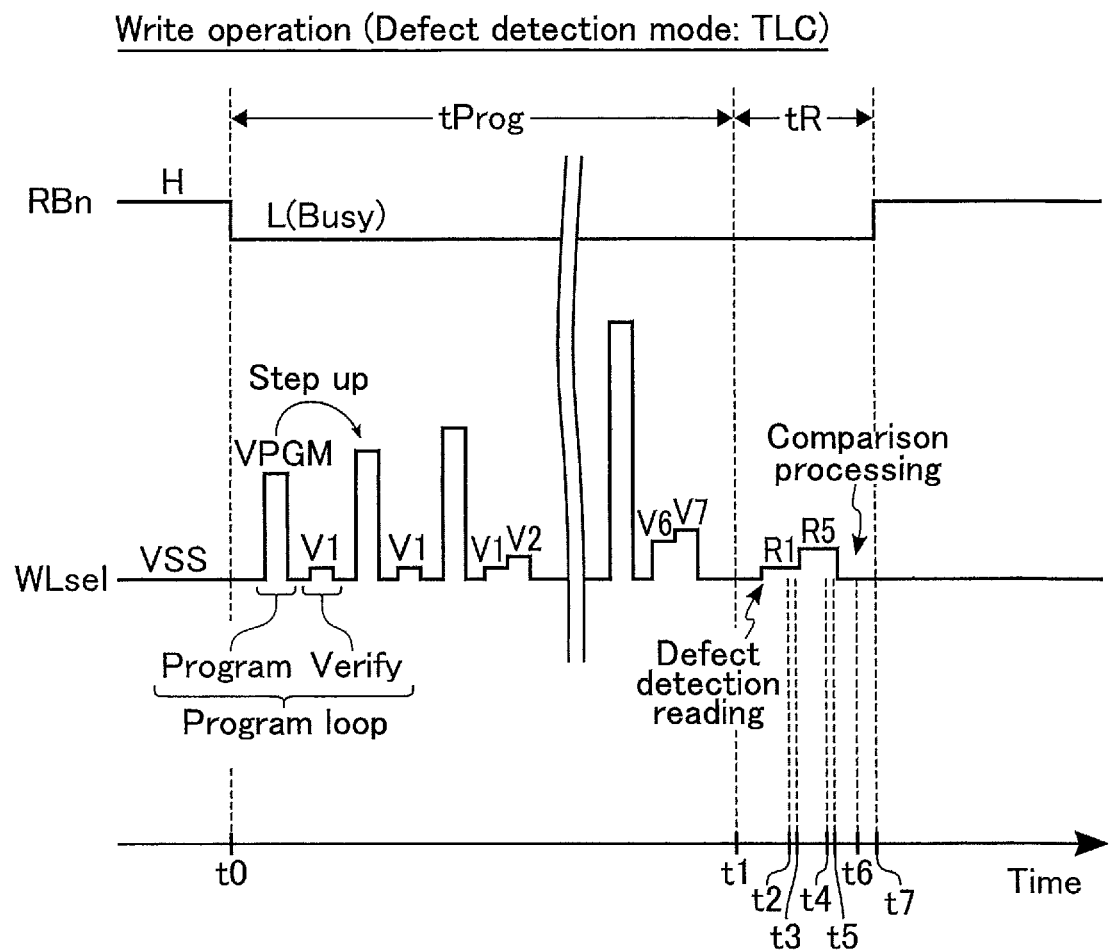
FIG. 16 is a timing chart showing an example of the write operation in the defect detection mode in the memory device according to the first embodiment.

FIG. 16 shows an example of a timing chart of the write operation in the defect detection mode in the memory device MD according to the first embodiment and displays the ready/busy signal REn and the voltage applied to the selected word line WLsel. In this example, a case where the defect detection target is a lower page will be described. As shown in FIG. 16, the sequencer 104 executes the program loop when the write operation in the defect detection mode starts. The voltage applied to the word line WLsel selected in the program loop in the write operation in the defect detection mode is the same as that in the write operation in the normal mode.

When the sequencer 104 repeatedly executes the program loop and detects the program pass of all states, or detects that the number of program loops exceeds a predetermined number of times, the sequencer 104 executes the defect detection reading. In the defect detection reading, the sequencer 104 executes the read operation of the page as a defect detection target. Specifically, when the lower page is the defect detection target, the read voltages R1 and R5 are applied to the selected word line WLsel. Then, the sequencer 104 executes the comparison process using a read result of the defect detection reading. When the comparison process is completed, the sequencer 104 transitions the memory device MD from the busy state to the ready state.

In FIG. 16, the time t0 corresponds to the time at the start of writing (program loop). The time t1 corresponds to the time at the end of writing (program loop). Times t2 and t3 correspond to the times of operation corresponding to the read voltage R1 in the defect detection reading. Times t4 and t5 correspond to the times of the operation corresponding to the read voltage R5 in the defect detection reading. Time t6 corresponds to the time of the comparison process. Time t7 corresponds to the time when the comparison process is completed.

FIG. 17 shows an example of the method of using the latch circuit in the write operation in the defect detection mode of the memory device MD according to the first embodiment, and displays transition of the data stored by the latch circuit during the write operation corresponding to FIG. 16.

At the time t0, for example, the latch circuits ADL, BDL, and CDL store the write data of the lower, middle, and upper bits, respectively. Then, at the time t1, the latch circuit ADL stores the write data of the lower bit, and the latch circuits BDL and CDL store invalid data. That is, in the write operation in the defect detection mode, the write data of the lower bit, which is the defect detection target, is maintained, and the other write data is discarded.

At the time t2, the read result by the read voltage R1 is stored in the latch circuit SDL. At the time t3, the read result by the read voltage R1 is transferred from the latch circuit SDL to the latch circuit DDL. At the time t4, the read result by the read voltage R5 is stored in the latch circuit SDL. At the time t5, the read data of the lower bit is calculated based on the read result by the read voltage R1 stored in the latch circuit DDL and the read result by the read voltage R5 stored in the latch circuit SDL. Then, the calculated read data of the lower bit is stored in the latch circuit DDL.

At the time t6, an exclusive-OR (EXOR) operation is performed between the write data of the lower bit stored in the latch circuit ADL and the read data of the lower bit stored in the latch circuit DDL. Then, the result of the exclusive-OR operation is stored as an expected-value comparison result in the latch circuit XDL. The expected-value comparison result stored in the latch circuit XDL is transferred to the counter 110, and the counter 110 counts, for example, "1" of the expected-value comparison result. "1" in the expected-value comparison result indicates that the write data of the lower bit and the read data of the lower bit are different. That is, the count result of the expected-value comparison result by the counter 110 corresponds to the number of the memory cell transistors MT (the number of error bits) in case of failure in writing. After that, by the process of step S122, the number of error bits and the reference value are compared, and the value of the status information STS in the status register 102A is updated.

In the above description, the lower page is used as the page as a defect detection target; however, the calculation is similarly executed for the other pages. Although the case where the target of defect detection is one page has been illustrated, a plurality of pages may be selected as the targets of defect detection. In this case, during a period of the defect detection reading, the defect detection reading and comparison processing is executed for each page which is the defect detection target. Then, the sequencer 104 executes a comparison process between the read result of a plurality of pages and the write data of a plurality of pages. Specifically, when the lower page and the middle page are the defect detection targets, the exclusive-OR operation of the write data and the read data of the lower bit and the exclusive-OR operation of the write data and the read data of the middle bit are executed. The method of using the latch circuit in the defect detection reading and comparison processing is not limited to this method. For example, as the latch circuit used for the defect detection reading, a latch circuit in which write data is discarded may be used.

[1-3] Effects of First Embodiment

According to the memory system 1 according to the first embodiment described above, reliability of the data stored in the memory system 1 can be enhanced. Hereinafter, effects of the memory system 1 according to the first embodiment will be described in detail using Comparative Examples.

Figure 18:
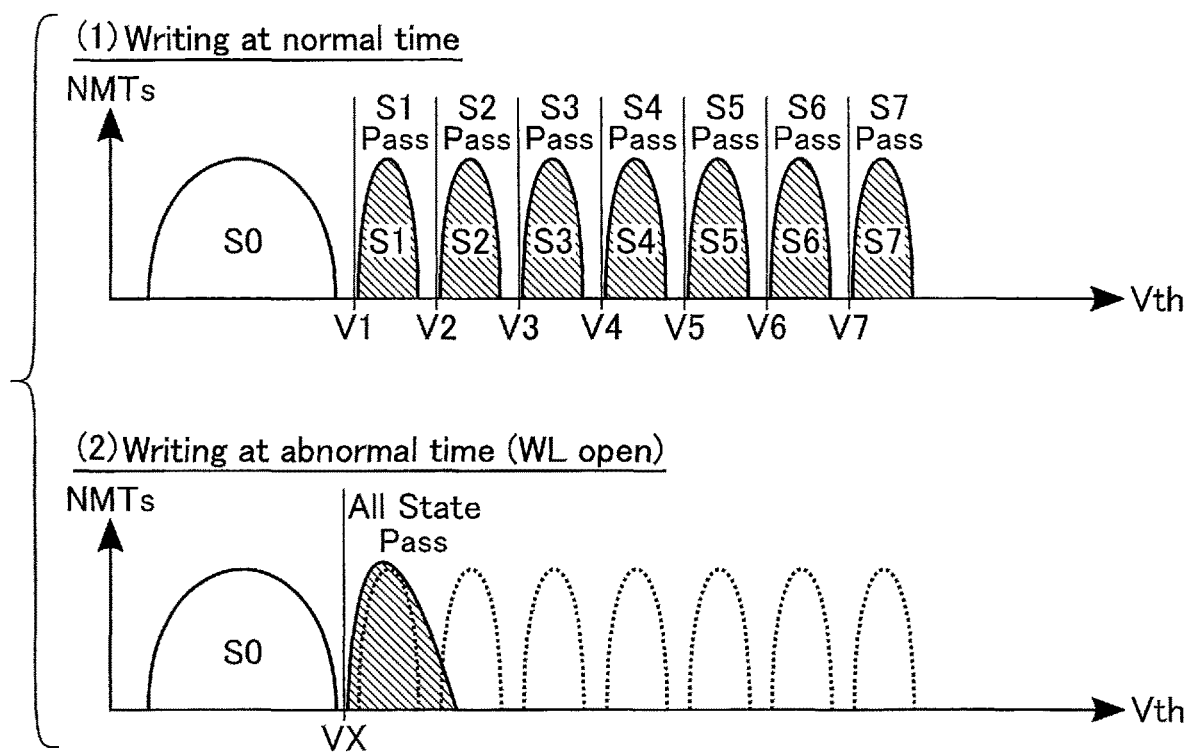
FIG. 18 is a schematic diagram showing an example of a distribution of threshold voltage of a memory cell transistor when a word-line defect occurs in the memory device.

FIG. 18 shows an example of a distribution of the threshold voltage of the memory cell transistor MT when a defect of the word line WL occurs in the memory device MD. A data writing method in this example corresponds to the TLC mode. (1) of FIG. 18 shows the threshold distribution of the memory cell transistor MT formed by writing where there is no defect in the word line WL, that is, writing at normal time. (2) of FIG. 18 shows the threshold distribution of the memory cell transistor MT formed by writing where an open defect occurs in the word line WL, that is, writing at abnormal time.

As shown in (1) of FIG. 18, when the write operation is completed with no defect in the word line WL, eight states are formed. These eight states are formed by passing the verify operation using the verify voltages V1 to V7. On the other hand, for example, when the open defect occurs in the word line WL, it becomes difficult to apply a desired voltage to the word line WL. Then, as shown in (2) of FIG. 18, in the verify operation of each state, for example, a voltage VX (for example, 0 V) is applied to the control gate of the memory cell transistor MT instead of a desired verify voltage.

The sequencer 104 of the memory device MD cannot determine whether or not the voltage applied to the control gate of the memory cell transistor MT is different from the desired verify voltage. Furthermore, since the sequencer 104 determines the verify pass based on the on/off of the memory cell transistor MT, the sequencer 104 may make an erroneous determination in the verify operation. For example, the sequencer 104 executes the verify operation using the voltage VX by writing in all states, and normally completes the write operation based on the verify pass in the erroneous determination. As described above, when a physical failure has occurred, even if the write operation is normally completed, the actually written data may not be able to form a desired threshold voltage distribution.

Such physical defects may occur even after a product has been shipped. Since the memory controller 20 believes the result of the status read, the memory controller 20 recognizes that the data is normally written to the cell unit CU in which the physical defect has occurred. When the data of the cell unit CU cannot be read, the memory controller 20 executes the read operation for the purpose of relieving the data, such as tracking read using a plurality of types of read voltages. However, since correctly written data does not exist in the cell unit CU, the write data assigned to the cell unit CU is lost. Thus, the memory system 1 preferably has a method of detecting an acquired physical defect at the time of writing data.

As the method of detecting the acquired physical defect, it is conceivable to compare the write data stored by the memory controller 20 with the data read from the cell unit CU. The memory controller 20 can detect the word line WL in which the physical defect has occurred by counting the number of error bits based on the comparison result and detecting that the number of error bits exceeds the reference value. As a result, the memory system 1 can detect a physical defect before discarding the write data and execute the write operation in which the word line WL in which the physical defect has not occurred is selected. Therefore, the memory system 1 can avoid the loss of the write data due to the physical defect.

FIG. 19 shows an example of a command sequence of a defect detection operation in Comparative Example of the first embodiment; As shown in FIG. 19, in Comparative Example of the first embodiment, the memory controller 20 confirms whether or not the writing is successful by the status read after executing the write operation of the three page data. Then, the memory controller 20 executes the read operation in which a page (for example, a lower page) as a defect detection target is selected after the writing is completed. Then, read data "bout" is output to the memory controller 20, and the defect detection process is executed. As described above, the defect detection operation in Comparative Example of the first embodiment includes the output of the read data after the write operation is executed.

Figure 20:
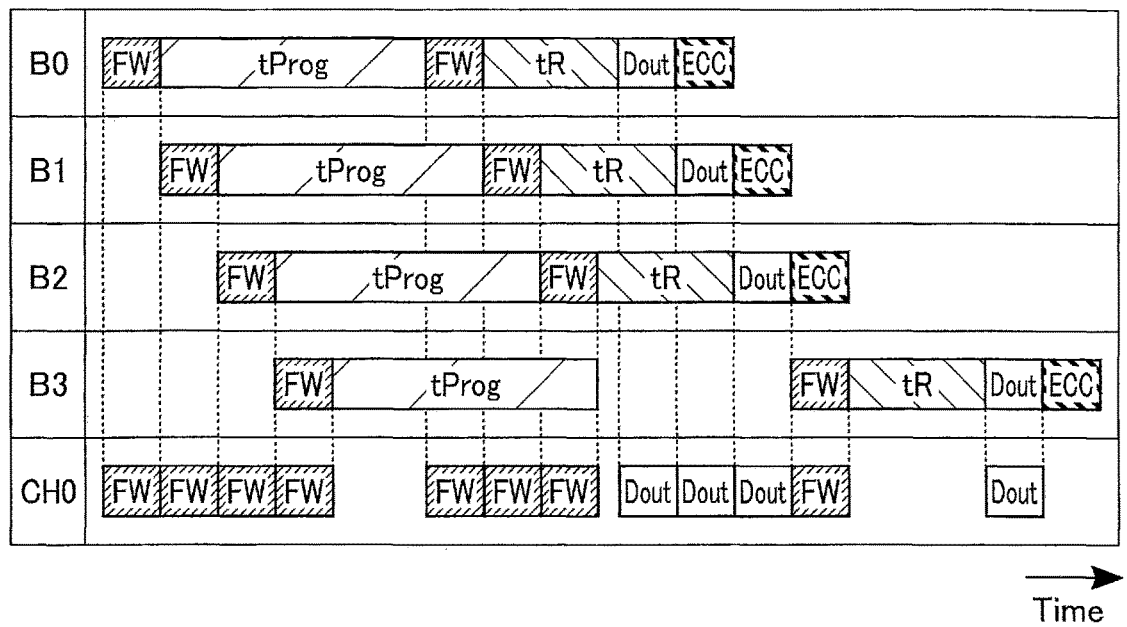
FIG. 20 is a schematic diagram showing an example of a writing sequence using a specific channel in Comparative Example of the first embodiment.

However, the output of the read data in the defect detection operation may cause a conflict of operation between the memory devices MD sharing the channel CH. FIG. 20 shows an example of a writing sequence using the channel CH0 in Comparative Example of the first embodiment. "FW" corresponds to a transmission period of the command set to the memory device MD by the memory controller 20. "ECC" corresponds to a period of the error correction processing by the ECC circuit 24. The illustration of the operation related to the status read is omitted.

As shown in FIG. 20, the memory controller 20 gives an instruction on the execution of the write operation in the order of the banks B0 to B3. Then, the memory device MD having received the "FW" executes the write operation ("tProg"). When the write operation is terminated, the memory controller 20 transmits a command set related to the defect detection reading to the memory device MD, and the memory device MD executes the defect detection reading ("tR"). When the defect detection reading is completed, the read data is output to the memory controller 20 ("Dout"), and the ECC circuit 24 executes the error correction processing for the received read data ("ECC"). Instead of the ECC circuit 24 executing the error correction processing, the memory controller 20 stores data specified by an instruction of the write operation in the RAM 23, and after the read data is output to the memory controller 20 ("Dout"), the comparison process between the data stored in the RAM 23 and the read data may be executed.

The channel CH0 is used, for example, for transmission of the command set by the memory controller 20 and reception of the read data. When the memory device MD executes some operations, the memory controller 20 can process these operations in parallel. On the other hand, in this example, the transmission of the command set of the defect detection reading corresponding to the bank B3 and the output of the read data by the defect detection reading corresponding to the bank B0 conflict with each other. When such a conflict occurs, one of processes in the operation having conflicted is postponed, and the process of the entire write operation becomes long.

On the other hand, the memory system 1 according to the first embodiment continuously executes data writing and defect detection reading in the write operation in the defect detection mode. Then, the comparison process for defect detection is executed by the memory device MD.

Briefly, the memory device MD executes the write operation in defect detection mode based on the prefix command added to the command set of the write operation. In the write operation in the defect detection mode, the latch circuit in the sense amplifier unit SAU stores the write data of the page as a defect detection target even after the writing is completed. Then, after the writing is completed, the memory device MD subsequently executes the read operation (defect detection reading) of the page specified by the prefix command.

Then, the expected-value comparison result is calculated based on the result of the read operation and the write data in the latch circuit. The sequencer 104 detects the occurrence of a physical defect in the cell unit CU by comparing the count result of the expected-value comparison result with the reference value, and updates the status information STS in the status register 102A. By referring to the status information STS after writing, the memory controller 20 can detect a physical defect of the word line WL (cell unit CU) as in Comparative Example of the first embodiment.

Figure 21:
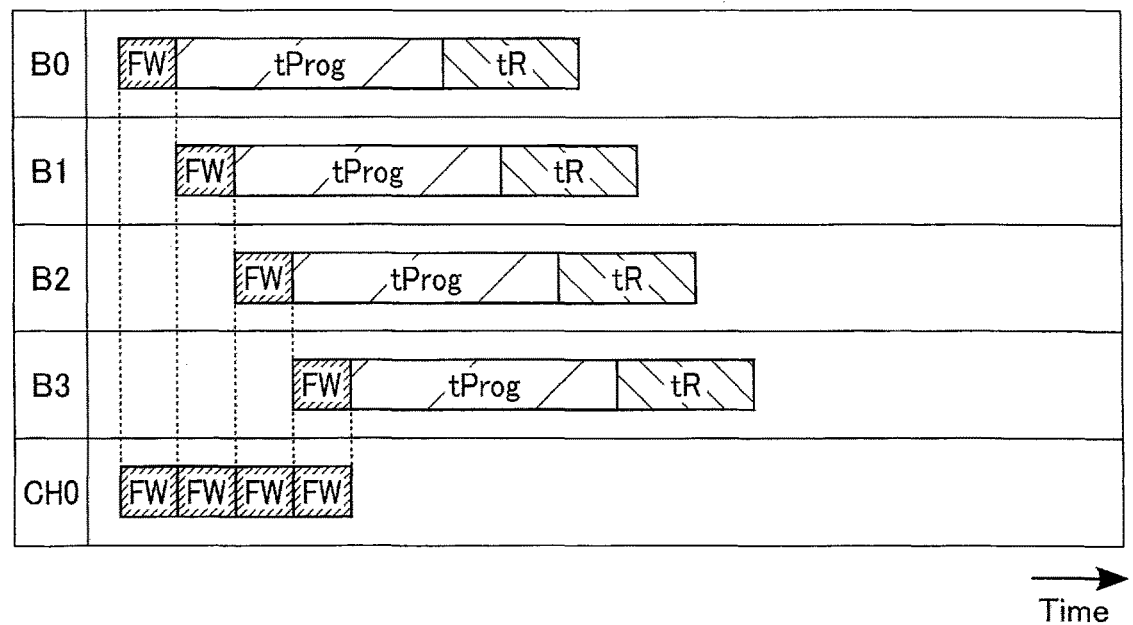
FIG. 21 is a schematic diagram showing an example of the writing sequence using a specific channel in the memory device according to the first embodiment.

FIG. 21 shows an example of the writing sequence using the channel CH0 in the first embodiment. As shown in FIG. 21, in the memory system 1 according to the first embodiment, the transmission of the command set, the output of the read data, and the error correction process between the write period and the defect detection reading period are omitted with respect to Comparative Example of the first embodiment. Thus, the defect detection operation in the memory system 1 according to the first embodiment can suppress the occurrence of operation conflict between the banks sharing the channel CH. In other words, in the defect detection operation in the memory system 1 according to the first embodiment, data out is not required, so that the concern of conflict in each of the channels CH is reduced.

As described above, the memory system 1 according to the first embodiment can enhance the reliability of data by utilizing the read operation in the defect detection mode, as in Comparative Example of the first embodiment. Furthermore, in the memory system 1 according to the first embodiment, since data out and error correction processing are omitted in the read operation in the defect detection mode, the power consumption can be suppressed as compared with Comparative Example of the first embodiment, and latency can be further improved.

[1-4] Variation of First Embodiment

The memory system 1 according to the first embodiment can be modified in various ways. Hereinafter, a first variation, a second variation, a third variation, and a fourth variation of the first embodiment will be described in order.

First Variation of First Embodiment

In the first embodiment, the case where the write operation in the defect detection mode is executed in the TLC mode (3 bits/cell) has been illustrated, but the present invention is not limited to this case. The write operation in the defect detection mode may be combined with other storage methods. Hereinafter, as the first variation of the first embodiment, a command sequence where each of the SLC mode, the MLC mode, and the QLC mode and the write operation in the defect detection mode are combined will be described.

Figure 22:
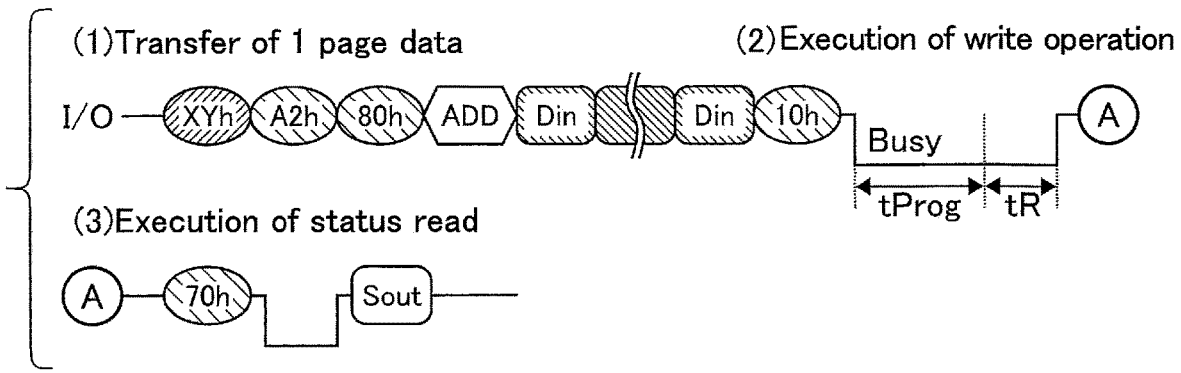
FIG. 22 is a schematic diagram showing an example of the command sequence of the write operation in the defect detection mode in a first variation of the first embodiment.

FIG. 22 shows an example of the command sequence when the write operation in the defect detection mode is executed in the SLC mode. As shown in FIG. 22, the memory controller 20 transmits a command set, including one page data assigned to the cell unit CU to be written, to the memory device MD. Specifically, the memory controller 20 transmits the prefix command "XYh", a command "A2h", the command "80h", the address information "ADD", the write data "Din" of one page, and the command "10h" to the memory device MD in this order. The command "A2h" is a command that gives an instruction on operation corresponding to the SLC mode. When the memory device MD receives the command "10h", the memory device MD transitions from the ready state to the busy state and executes the write operation including the defect detection reading and comparison processing in the SLC mode.

Figure 23:
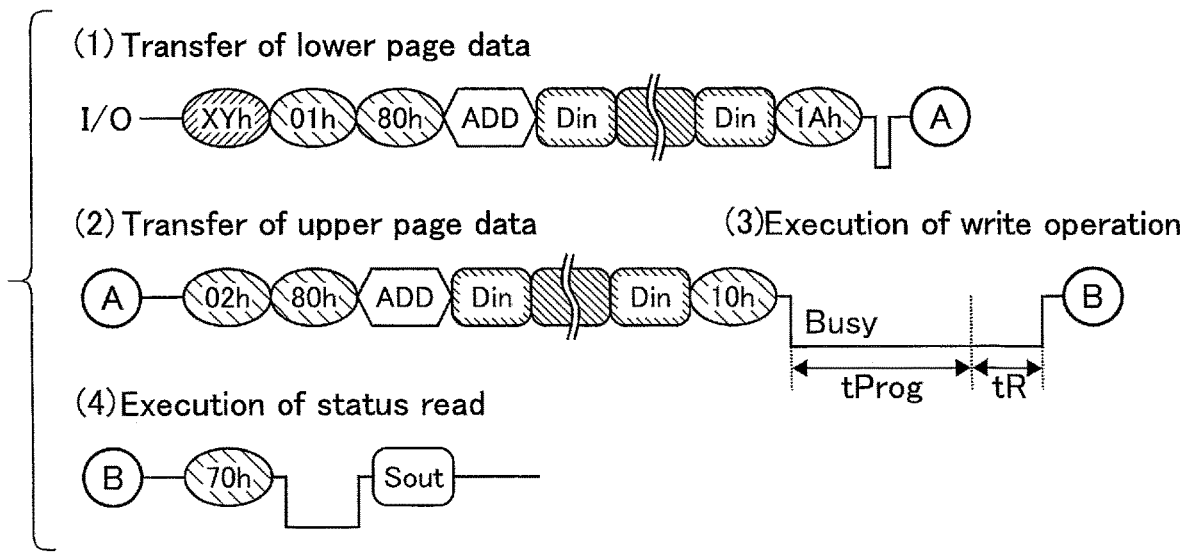
FIG. 23 is a schematic diagram showing an example of the command sequence of the write operation in the defect detection mode in the first variation of the first embodiment.

FIG. 23 shows an example of the command sequence when the write operation in the defect detection mode is executed in the MLC mode. As shown in FIG. 23, the memory controller 20 first transmits the prefix command "XYh" to the memory device MD. Then, the memory controller 20 transmits the lower page data and the upper page data to the memory device. MD by using the same command set as the write operation in the normal mode. In the transfer of the upper page data, the command "10h" is transmitted finally. When the memory device MD receives the command "10h", the memory device MD transitions from the ready state to the busy state and executes the write operation including the defect detection reading and comparison processing in the MLC mode.

FIG. 24 shows an example of the command sequence when the write operation in the defect detection mode is executed in the QLC mode. As shown in FIG. 24, the memory controller 20 first transmits the prefix command "XYh" to the memory device MD. Then, the memory controller 20 transmits the lower page data, the middle page data, the upper page data, and the top page data to the memory device MD by using the same command set as the write operation in the normal mode. In the transfer of the top page data, the command "04h" is transmitted first, and the command "10h" is transmitted finally. The command "04h" is a command that gives an instruction on operation corresponding to the data of the fourth page. When the memory device MD receives the command "10h", the memory device MD transitions from the ready state to the busy state and executes the write operation including the defect detection reading and comparison processing in the QLC mode.

In each write operation in the first variation of the first embodiment, the same status read as in the first embodiment is executed after the write operation including the defect detection reading and comparison processing is executed. The status information STS transferred to the memory controller 20 by the status read may include at least the defect detection result of the page set as the defect detection target in each storage method. Data of five or more bits may be stored in one memory cell transistor MT. When such a storage method (5 bits/cell) is applied and the write operation in the defect detection mode is executed, the memory controller 20 adds the prefix command ("XYh") giving an instruction on the use of the defect detection mode to the command set to be transmitted first and transmits the command set to the memory device MD. As a result, the memory device MD can execute the write operation in the defect detection mode regardless of the data storage method used.

Second Variation of First Embodiment

In the first embodiment, the case where "XYh" is used as the prefix command that gives an instruction on the defect detection mode is illustrated, but the present invention is not limited to this case. The memory system 1 may use a plurality of types of prefix commands properly for each combination of pages as the defect detection targets. Hereinafter, as the second variation of the first embodiment, a combination of the prefix command and the page as the defect detection target will be described.

FIG. 25 shows an example of a combination of the prefix command and the page as the defect detection target in the second variation of the first embodiment. "L", "M", "U", and "T" shown in FIG. 25 correspond to the lower, middle, upper, and top page data, respectively. In the SLC mode, one cell unit CU stores one page data including "L". In the MLC mode, one cell unit CU stores two page data including "L" and "U". In the TLC mode, one cell unit CU stores three page data including "L", "M", and "U". In the QLC mode, one cell unit CU stores four page data including "L", "M", "U", and "T".

When the SLC mode and the defect detection mode are combined, the memory system 1 uses, for example, one type of command "X1h" as the prefix command in the defect detection mode. The command "X1h" is associated with "L" in the SLC mode.

When the MLC mode and the defect detection mode are combined, the memory system 1 properly uses, for example, three types of commands "X1h", "X2h", and "X3h" as the prefix commands in the defect detection mode. The commands "X1h", "X2h", and "X3h" are associated with "L", "U", and "L/U" in the MLC mode, respectively.

When the TLC mode and the defect detection mode are combined, the memory system 1 uses, for example, seven types of commands "X1h", "X2h", "X3h", "X4h", "X5h", "X6h", and "X7h" as the prefix commands in the defect detection mode. The commands "X1h", "X2h", "X3h", "X4h", "X5h", "X6h", and "X7h" are associated with "L", "M", "U", "L/M", "L/U", "M/U", and "L/M/U" in the TLC mode, respectively.

When the QLC mode and the defect detection mode are combined, the memory system 1 properly uses, for example, thirteen types of commands "X1h", "X2h", "X3h", "X4h", "X5h", "X6h", "X7h", "X8h", "X9h", "XAh", "XBh", "XCh", and "XDh" as the prefix commands in the defect detection mode. The commands "X1h", "X2h", "X3h", "X4h", "X5h", "X6h", "X7h", "X8h", "X9h", "XAh", "XBh", "XCh", and "XDh" are associated with "L", "SM", "U", "T", "L/M", "L/U", "L/T", "M/U", "M/T", "U/T", "L/M/U", "M/U/T", and "L/M/U/T" in the QLC mode, respectively.

When the memory device MD receives the prefix command in the defect detection mode described above, the memory device MD executes the write operation in the defect detection mode with the associated page as the defect detection target. The combination of the prefix command in the defect detection mode and the page as the defect detection target is not limited to the combination described above. The prefix command assigned to the defect detection mode can be set to any command.

Third Variation of First Embodiment

In the write operation in the defect detection mode described in the first embodiment, the reference value N1 used in the process of step S122 can be changed based on the instruction of the memory controller 20. A setting change operation for changing the reference value N1 will be described below as a third variation of the first embodiment. The setting change operation may be called "Set Feature".

FIG. 26 shows an example of a command sequence of the setting change operation in the third variation of the first embodiment. As shown in FIG. 26, in the setting change operation, the memory controller 20 transmits a command "EFh", address information "ADD1", setting data "D0h", "D1h", "D2h", and "D3h" to the memory device MD in this order. The command "EFh" is a command that gives an instruction on the setting change operation. The address information "ADD1" indicates an address (threshold setting address) in which a parameter corresponding to the reference value N1 is stored. The setting data "D0h" to "D3h" in the third variation of the first embodiment include parameters applied to the reference value N1.

When the memory device MD receives the address information "ADD1" and the setting data "D0h" to "D3h" after receiving the command "EFh", the memory device MD transitions from the ready state to the busy state. Then, the memory device MD changes the parameter corresponding to the reference value N1 to the parameter included in the setting data "D0h" to "D3h". When the setting change is completed, the memory device MD transitions from the busy state to the ready state and terminates the setting change operation. The setting data may be transmitted in at least one cycle, and may be the same as the number of cycles associated with the command "EFh".

As described above, the memory system 1 may change the reference value N1 used in the process of step S122. When the reference value N1 is set to a high value, sensitivity of defect detection becomes low, and a performance of the memory system 1 is enhanced. On the other hand, when the reference value N1 is set to a low value, the sensitivity of defect detection becomes high, and reliability of the memory system 1 is enhanced. The memory system 1 can adjust a balance between the performance and the reliability of the memory system 1 by changing the sensitivity of defect detection according to a user's request.

Fourth Variation of First Embodiment

In the write operation in the defect detection mode described in the first embodiment, the read voltage used in the defect detection reading may be different from the read voltage used in the normal read operation. Hereinafter, as the fourth variation of the first embodiment, the setting change operation for the read voltage used in the defect detection reading will be described.

FIG. 27 shows an example of a command sequence of the setting change operation in the fourth variation of the first embodiment. As shown in FIG. 27, in the setting change operation, the memory controller 20 transmits the command "EFh", address information "ADD2", the setting data "D0h", "D1h", "D2h", and "D3h" to the memory device MD in this order. The address information "ADD2" indicates an address (read voltage setting address) in which a parameter corresponding to the read voltage used in the defect detection reading is stored. The setting data "D0h" to "D3h" in the fourth variation of the first embodiment include parameters applied to the read voltage used in the defect detection reading. As such a parameter, for example, a shift value from a reference read voltage is used.

When the memory device MD receives the address information "ADD2" and the setting data "D0h" to "D3h" after receiving the command "EFh", the memory device MD transitions from the ready state to the busy state. Then, the memory device MD changes the parameter corresponding to the read voltage used in the defect detection reading to the parameter included in the setting data "D0h" to "D3h". When the setting change is completed, the memory device MD transitions from the busy state to the ready state and terminates the setting change operation. The setting data may be transmitted in at least one cycle, and may be the same as the number of cycles associated with the command "EFh".

As described above, the memory system 1 can change the read voltage used in the defect detection reading. Hereinafter, the effect of the fourth variation of the first embodiment will be described with reference to FIG. 28. FIG. 28 shows an example of a change of the distribution of the threshold voltage of the memory cell transistor MT. (1) of FIG. 28 shows the distribution of the threshold voltage of the memory cell transistor MT immediately after data writing. (2) of FIG. 28 shows the distribution of the threshold voltage of the memory cell transistor MT after a predetermined time has elapsed since the data writing.

As shown in FIG. 28, the distribution of the threshold voltage of the memory cell transistor MT changes with the passage of time. The threshold voltage of the memory cell transistor MT is particularly unstable immediately after the data is written, and tends to stabilize after a lapse of a predetermined time. For example, the distribution of the threshold voltage of the memory cell transistor MT decreases and then stabilizes (Vth shift) as shown in (2) of FIG. 28.

Thus, the memory device MD suppresses occurrence of a read error by setting the read voltage optimized for the state shown in (2) of FIG. 28 during the read operation. On the other hand, the defect detection reading is a read operation executed immediately after the data is written. Thus, it is conceivable that an optimum value of the read voltage in the defect detection reading and an optimum value of the read voltage in the normal read operation are different.

Thus, the memory system 1 according to the fourth variation of the first embodiment changes the read voltage used in the defect detection reading according to the distribution of the threshold voltage of the memory cell transistor MT immediately after writing by the setting change operation. For example, read voltages R1' to R7' used in the defect detection reading are set higher than the read voltages R1 to R7 used in the normal read operation, respectively.

As a result, the memory system 1 according to the fourth variation of the first embodiment can suppress erroneous reading in defect detection reading. As a result, the memory system 1 according to the fourth variation of the first embodiment can improve determination accuracy of the status fail in the read operation in the defect detection mode, and can suppress occurrence of unnecessary rewriting.

[2] Second Embodiment

A memory system 1 according to the second embodiment has the same configuration as that of the first embodiment. The memory system 1 according to the second embodiment uses at least two types of write modes and executes a two-step write operation. Hereinafter, points of the memory system 1 according to the second embodiment different from the first embodiment will be described.

[2-1] Write Operation

[2-1-1] Outline of Write Operation

FIG. 29 shows an example of a flow of the write operation of the memory system 1 according to the second embodiment. As shown in FIG. 29, the memory system 1 first receives write data from a host device 30 (step S200). Then, the memory system 1 executes a buffer write operation using the received write data (step S201).

The buffer write operation is a high-speed write operation for storing data in a buffer region of a memory device MD. The buffer region is a storage region allocated for the buffer write operation in a memory cell array 107. In the buffer write operation, for example, an SLC mode and a defect detection mode are used. The command sequence and timing chart of the buffer write operation are the same as those of the write operation in the defect detection mode described in the first embodiment.

When a task based on an instruction from the host device 30 is completed after the processing in step S201 is completed, the memory system 1 transitions to an idle state (step S202). When the memory system 1 transitions to the idle state after the buffer write operation, the memory system 1 executes the compaction operation without depending on the instruction from the host device 30 (step S203). The compaction operation may be executed at least after the buffer write operation.

The compaction operation includes a buffer read operation and a compaction write operation. The buffer read operation is an operation of reading data written by the buffer write operation. The compaction write operation is an operation of writing the data read by the buffer read operation to the memory device MD by using a storage method in which the number of bits stored in one memory cell transistor MT is larger than that in the buffer write operation. In the compaction write operation, for example, a TLC mode and the defect detection mode are used.

[2-1-2] Compaction Operation

FIG. 30 shows an example of a flow of the compaction operation of the memory system 1 according to the second embodiment. As shown in FIG. 30, a memory controller 20 first executes the read operation in the buffer region, reads the data (valid data) written by the buffer write operation, and stores the data in the RAM 23 (step S210). Subsequently, the memory controller 20 confirms whether collection of valid data from the buffer region is completed (step S211). If the collection of valid data is not completed (step S211, NO), the process returns to step S210. On the other hand, when the collection of valid data is completed (step S211, YES), the process proceeds to step S212.

In the process of step S212, the memory controller 20 sets an operation parameter of the defect detection mode. For example, the memory controller 20 sets a page or the like as a defect detection target in the process of step S212. Then, the memory controller 20 instructs the memory device MD on the write operation using the TLC mode and the defect detection mode (step S213).

When the write operation of the memory device MD is completed, the memory controller 20 reads status information from the memory device MD and confirms whether or not the status of the write operation is a pass (step S214). If the status is not the pass (step S214, NO), the memory controller 20 changes a write destination (step S215) and returns to the process of step S212. On the other hand, if the status is the pass (step S214, YES), the memory controller 20 updates a lookup table LUT based on an address to which the data is written by the write operation (step S216). Then, the written valid data is discarded from the RAM 23.

After that, the memory controller 20 confirms whether or not the compaction operation is completed (step S217). Specifically, the memory controller 20 confirms whether or not the write operation for all valid data stored in the RAM 23 is completed. If the write operation for all valid data stored in the RAM 23 is not completed (step S217, NO), the memory controller 20 returns to the process of step S212. On the other hand, when the write operation for all valid data stored in the RAM 23 is completed, the compaction operation is terminated (step S217, YES).

(Command Sequence of Compaction Operation)

FIG. 31 shows an example of a command sequence of the compaction operation of the memory system 1 according to the second embodiment, and displays communication of an input/output signal I/O between the memory controller 20 and the memory device MD. The memory system 1 sequentially executes the operations of (1) to (8) of FIG. 31 described in detail below in the compaction operation. (1) to (3) of FIG. 31 correspond to the buffer read operation. (4) to (8) of FIG. 31 correspond to the compaction write operation.

As shown in (1) of FIG. 31, the memory system 1 first reads the one page data for which the buffer region is selected and executes error correction processing. Specifically, the memory controller 20 transmits a command "A2h", a command "ooh", address information "ADD", and a command "30h" to the memory device MD in this order. The command "ooh" is a command giving an instruction on the read operation. The address information "ADD" includes an address assigned to the buffer region. The command "30h" is a command giving an instruction on start of the read operation. When the memory device MD receives the command "30h", the memory device MD transitions from the ready state to the busy state and executes the read operation. When the read operation is completed, the memory device MD transitions from the busy state to the ready state.

When the memory controller 20 detects that the memory device MD has transitioned from the busy state to the ready state after giving an instruction on the execution of the read operation, the memory controller 20 causes the memory device MD to output read data "Dout". When the memory controller 20 receives the read data "Dout", the memory controller 20 performs error correction processing on the received read data. The corrected read data is stored in, for example, the RAM 23.

Subsequently, as shown in (2) and (3) of FIG. 31, the memory system 1 reads the one page data for which the buffer region is selected and executes the error correction processing twice in succession. The operation corresponding to (2) of FIG. 31 and the operation corresponding to (3) of FIG. 31 are the same as the operation corresponding to (1) of FIG. 31. As a result, the RAM 23 stores three page data read from a temporary high-speed write region (buffer region) in the memory device MD. This three page data corresponds to the lower, middle, and upper page data in the write operation in the TLC mode.

The memory controller 20 executes the compaction write operation when at least three page data is stored in the RAM 23. The command sequence of the compaction write operation is the same as that of the write operation in the defect detection mode described in the first embodiment. The operations corresponding to (4) to (8) of FIG. 31 are the same as the operations corresponding to (1) to (5) of FIG. 13, respectively. As a result, the three page data read from the three cell units CU in the buffer region is stored in one cell unit CU.

In the compaction operation, the buffer read operation and the compaction write operation do not have to be executed alternately. In other words, the memory system 1 first stores a predetermined amount of page data in the RAM 23 by a plurality of times of the buffer read operation. After that, the memory system 1 may continuously execute the compaction write operation. The memory system 1 may execute the compaction write operation by omitting the output of the read data to the memory controller 20 in the buffer read operation. In this case, the read result of a plurality of times of the buffer read operation is stored in a plurality of latch circuits of each sense amplifier unit SAU.

[2-2] Effects of Second Embodiment

According to the memory system 1 according to the second embodiment described above, it is possible to improve reliability of data and improve an operation speed of sequential writing. Hereinafter, effects of the memory system 1 according to the first embodiment will be described in detail.

One of performances required for memory systems such as SSD is the operation speed of sequential writing. The sequential writing corresponds to an operation of continuously writing the write data received by the memory system from the host device. As a method of improving the operation speed of the sequential writing, it is conceivable to write the write data received by the SSD from the host device in a high-speed write mode (for example, SLC mode). However, the high-speed write mode has a low data recording density.

Thus, the memory system 1 according to the second embodiment first writes data using the high-speed write mode (buffer write operation). After that, the memory system 1 reads the data written in the buffer region and executes the write operation using a high recording density write mode (compaction operation). As a result, the memory system 1 according to the second embodiment can suppress a decrease in the operation speed of the sequential writing, and can increase a storage capacity of the memory system 1.

The memory system 1 according to the second embodiment applies the defect detection mode to each of the buffer write operation and the compaction operation. As a result, the memory system 1 according to the second embodiment can detect a physical defect of the cell unit CU and can avoid a loss of the write data. Accordingly, the memory system 1 according to the second embodiment can improve the reliability of data as in the first embodiment.

[2-3] Variation of Second Embodiment

The memory system 1 according to the second embodiment can be modified in various ways. Hereinafter, a first variation and a second variation of the second embodiment will be described in order.

First Variation of Second Embodiment

In the second embodiment, the case where the SLC mode is used in the buffer write operation and the TLC mode is used in the compaction write operation has been described, but the present invention is not limited to this case. The data storage method used in the buffer write operation and the data storage method used in the compaction write operation may be in other combinations.

Figures 32, 33:
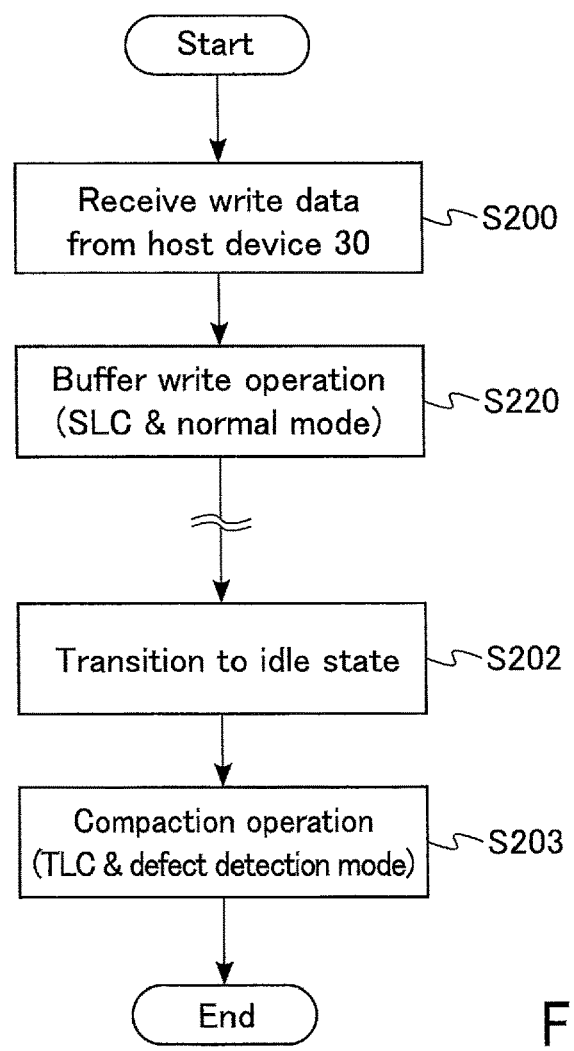
FIG. 32 is a table showing an example of a combination of a write mode between a buffer write operation and a compaction write operation in a first variation of the second embodiment.
FIG. 33 is a flowchart showing an example of the write operation in a second variation of the second embodiment.

FIG. 32 shows an example of a combination of the data storage method between the buffer write operation and the compaction write operation in the first variation of the second embodiment. As shown in FIG. 32, when the SLC mode is used for the buffer write operation, the MLC mode, TLC mode, or QLC mode is used for the compaction write operation. When the MLC mode is used for the buffer write operation, the TLC mode or the QLC mode is used for the compaction write operation. When the TLC mode is used for the buffer write operation, the QLC mode is used for the compaction write operation, for example. A data storage method of 5 bits/cell or more may be used for the compaction write operation.

Second Variation of Second Embodiment

In the second embodiment, the case where the defect detection mode is used in both the buffer write operation and the compaction write operation has been described, but the present invention is not limited to this case. The defect detection mode in the buffer write operation may be omitted.

FIG. 33 shows an example of the write operation in the second variation of the second embodiment. As shown in FIG. 33, the write operation in the second variation of the second embodiment has a configuration in which step S201 is replaced with step S220 in the flowchart shown in FIG. 29.

The buffer write operation in step S220 uses the SLC mode and the normal mode. In the compaction write operation in step S203, the TLC mode and the defect detection mode are used. As a result, the memory system 1 according to the second variation of the second embodiment can enhance a performance of the buffer write operation.

[3] Third Embodiment

A memory system 1 according to the third embodiment has the same configuration as that of the first embodiment. The memory system 1 according to the third embodiment applies the defect detection mode described in the first embodiment to garbage collection operation. Hereinafter, points of the memory system 1 according to the third embodiment different from the first and second embodiments will be described.

[3-1] Garbage Collection Operation

The garbage collection operation is a function that automatically releases an unnecessary region in a memory region allocated in a memory cell array 107. Briefly, the memory system 1 collects invalid data to be deleted and writes fragmented valid data to a new block BLK in the garbage collection operation. Then, the memory system 1 executes an operation of erasing the block BLK in which the invalid data is collected to form a free block BLK.

Figure 34:
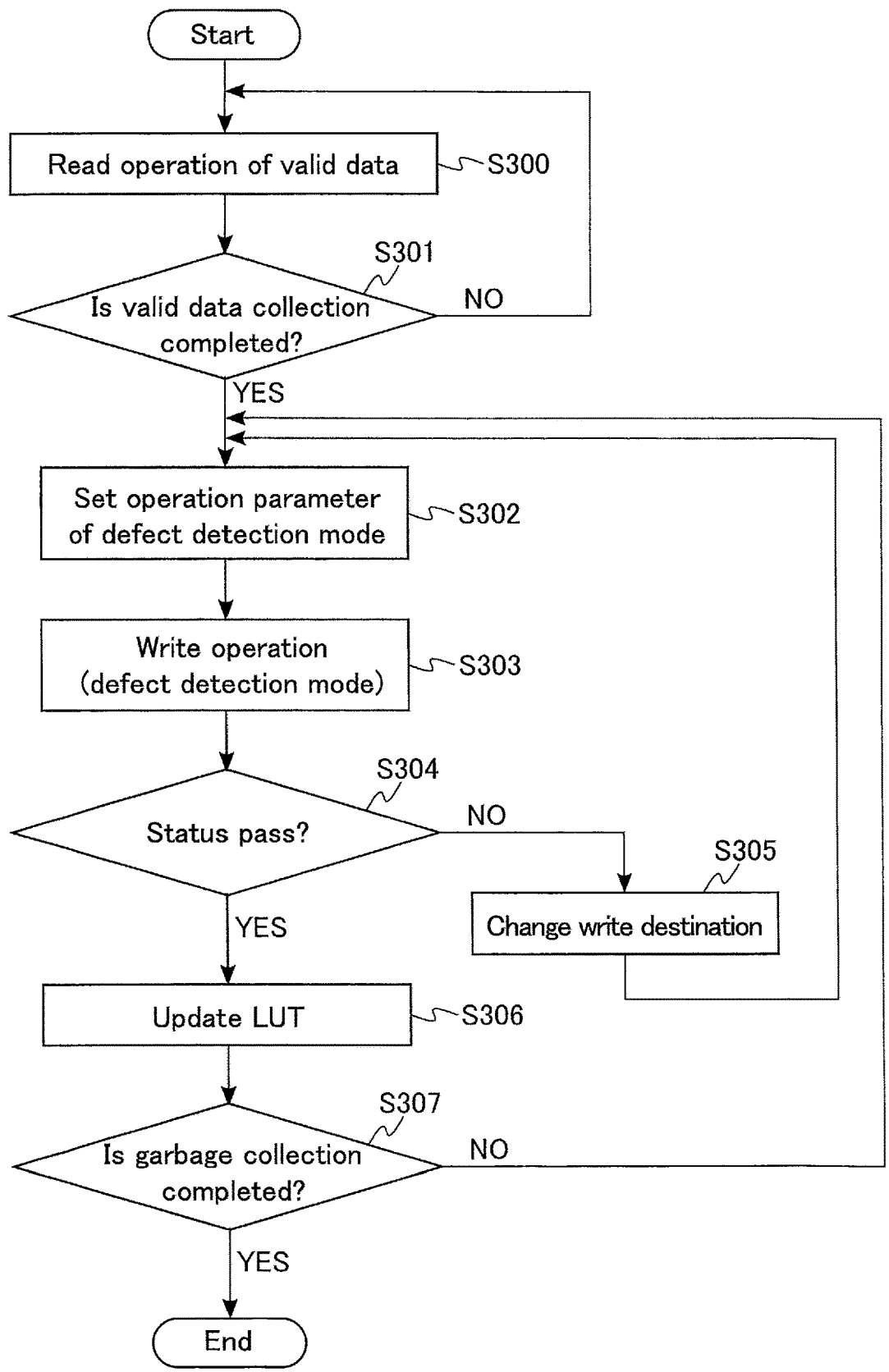
FIG. 34 is a flowchart showing an example of a garbage collection operation in a memory system according to a third embodiment.

FIG. 34 shows an example of a flow of the garbage collection operation in the memory system 1 according to the third embodiment. As shown in FIG. 34, a memory controller 20 first reads the valid data and stores the valid data in the RAM 23 (step S300). Subsequently, the memory controller 20 confirms whether the collection of valid data is completed (step S301). If the collection of valid data is not completed (step S301, NO), the process returns to step S300. On the other hand, when the collection of valid data is completed (step S301, YES), the process proceeds to step S302.

In the process of step S302, the memory controller 20 sets an operation parameter of the defect detection mode. For example, the memory controller 20 sets a page or the like as a defect detection target in the process of step S302. Then, the memory controller 20 instructs the memory device MD on the write operation using the defect detection mode (step S303).

When the write operation of the memory device MD is completed, the memory controller 20 reads status information from the memory device MD and confirms whether or not the status of the write operation is a pass (step S304). If the status is not the pass (step S304, NO), the memory controller 20 changes a write destination (step S305) and returns to the process of step S302. On the other hand, if the status is the pass (step S304, YES), the memory controller 20 updates a lookup table LUT based on an address to which the data is written by the write operation (step S306). Then, the written valid data is discarded from the RAM 23.

After that, the memory controller 20 confirms whether or not the garbage collection operation is completed (step S307). Specifically, the memory controller 20 confirms whether or not the write operation for all valid data stored in the RAM 23 is completed. If the write operation for all valid data stored in the RAM 23 is not completed (step S307, NO), the memory controller 20 returns to the process of step S302. On the other hand, when the write operation for all valid data stored in the RAM 23 is completed, the garbage collection operation is terminated (step S307, YES).

[3-2] Effects of Third Embodiment

As described above, the write operation in the defect detection mode may be used in the garbage collection operation. As a result, the memory system 1 according to the third embodiment can detect a physical defect of the cell unit CU and can avoid a loss of the valid data in the garbage collection operation. Accordingly, the memory system 1 according to the third embodiment can improve the reliability of data as in the first embodiment.

[4] Fourth Embodiment

A memory system 1 according to the fourth embodiment has the same configuration as that of the first embodiment. The memory system 1 according to the fourth embodiment applies the defect detection mode described in the first embodiment based on the W/E count of the block BLK to be written. Hereinafter, points of the memory system 1 according to the fourth embodiment different from the first to third embodiments will be described.

[4-1] Operation

FIG. 35 shows an example of the write operation in a second variation of the fourth embodiment. As shown in FIG. 35, the write operation in the second variation of the fourth embodiment has a configuration in which step S102 is replaced with step S400 in the flowchart shown in FIG. 7.

In the process of step S400, the memory controller 20 confirms whether or not the write/erase count (W/E count) of the block BLK to be written exceeds the reference value. If W/E count>reference value is not satisfied (step S400, NO), the memory controller 20 sets the write mode to the normal mode (step S103). On the other hand, if W/E count>reference value is satisfied (step S400, YES), the memory controller 20 sets the write mode to the defect detection mode (step S104). After step S103 or S104, the memory controller 20 transfers the write data to the memory device MD and instructs the memory device MD to execute the write operation according to the set write mode. Other operations of the memory device MD according to the fourth embodiment are the same as the operations described with reference to FIG. 7.

[4-2] Effects of Fourth Embodiment

Physical defects of a word line WL, etc. in the memory device MD are more likely to occur as the W/E count increases. Thus, the memory system 1 according to the fourth embodiment determines whether or not to use the defect detection mode based on the W/E count of the block BLK. The memory system 1 according to the fourth embodiment can improve the performance and latency of the memory system 1 by not using the defect detection mode for the block BLK with a small risk of occurrence of physical defects. Furthermore, the memory system 1 according to the fourth embodiment can enhance the reliability of data by utilizing the defect detection mode for the block BLK with a large risk of occurrence of physical defects, as in the first embodiment.

In the fourth embodiment, the case where the reference value for determining whether or not to use the defect detection mode is the W/E count has been illustrated, but the present invention is not limited to this case. For example, a temperature state of the memory system 1 may be used as a reference value for whether or not the defect detection mode is used. Any parameter can be used as the reference value for determining whether or not to use the defect detection mode.

[5] Other

In the above embodiments, each of the commands "01h" to "04h", "XYh", and "X1h" to "XDh" used in the description can be replaced by any command. The case where the commands "01h", "02h", "03h", and "04h" are used as the commands indicating the operation corresponding to the lower page, the middle page, the upper page, and the top page, respectively, has been described as an example. However, the commands "01h" to "04h" may be replaced with other commands. The command to specify a read page may be omitted by including information on the page in the address information ADD. A plurality of types of commands corresponding to the status read may be used properly. For example, the command "70h" may be used as a status read command corresponding to the write operation in the normal mode, and a command "7Xh" may be used as the status read command corresponding to the write operation in the defect detection mode. In the present specification, the case where the transmitted address information ADD is one cycle is exemplified. However, the address information transmitted in the read operation and the write operation may be a plurality of cycles (for example, five cycles).

In the read operation in the above embodiment, the voltage applied to the selected word line WL is, for example, the same voltage as the voltage of a signal line that the driver circuit 106 supplies the voltage to the row decoder module 108. That is, the voltage applied to various wires or the period during which the voltage is applied can roughly be known by examining the voltage of the corresponding signal line. In estimating the voltage of the select gate line, the word line, and the like from the voltage of each signal line connected to the driver circuit 106, a voltage drop due to a transistor included in the row decoder RD may be taken into consideration. In this case, each voltage of the select gate line and the word line becomes lower than the voltage applied to the corresponding signal line by the voltage drop of the transistor.

In the read operation in the above embodiment, the memory device MD may change the read voltage, applied to the selected word line WL, from a low level to a high level, or from a high level to a low level. The order in which the read voltage is applied can be changed as appropriate. In any case, the memory device MD can read data from the memory cell transistor MT. The coding described in the above embodiment is merely an example. The configurations and operations described above can be applied to any coding.

In this specification, an element including the input/output circuit 101, the logic control circuit 103, the sequencer 104, the ready/busy control circuit 105, and the driver circuit 106 may be referred to as a "controller" or a "control circuit". That is, the controller of the memory device MD can execute the write operation to the memory cell transistor MT based on the instruction from the external memory controller 20.

The "connection" in this specification means electrical connection and does not exclude the fact that another element is interposed in the connection. In the present specification, the "off state" means that a voltage less than the threshold voltage of the corresponding transistor is applied to a gate of the transistor, and, for example, it does not exclude the fact that a minute current such as a leak current of the transistor flows. The "buffer region" may refer to a storage region formed by a plurality of latch circuits included in the sense amplifier module 109. That is, the write data and the read data can be stored in the buffer region of the sense amplifier module 109.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a memory cell array including a memory cell that stores data nonvolatilely;
   a plurality of bit lines connected to the memory cell array;
   a plurality of sense amplifier units connected to the bit lines, respectively;
   a controller configured to perform a write operation to the memory cell; and
   a register configured to store a status information of the write operation,
   wherein
   the memory cell array includes a first storage region specified by a first address,
   the sense amplifier units include a buffer region capable of storing data, the buffer region includes first and second portions,
   when the controller receives a first command set including a first command indicating the write operation, the first address, and first data after receiving a first prefix command from an external memory controller, the controller is configured to:
   store the first data to the first portion of the buffer region;
   write the first data stored in the first portion of the buffer region to the first storage region;
   read, after the first data is written to the first storage region, second data from the first storage region while the first data is maintained in the buffer region,
   store the read second data to the second portion of the buffer region;
   compare the first data stored in the first portion of the buffer region and the read second data stored in the second portion of the buffer region, and update the status information stored in the register based on a result of the comparison; and
   when the controller receives a status read command after the write operation, the controller is configured to output the status information to the external memory controller;
   wherein the writing the first data stored in the first portion of the buffer region to the first storage region comprises executing a plurality of program loops each comprising a program operation and a verify operation, wherein, in each of the program loops,
   the controller is configured to:
   apply a program voltage to the memory cell in the program operation; and apply a verify voltage to the memory cell in the verify operation.

2. The memory device of claim 1, wherein
the comparison is exclusive-OR operation between the first data and the second data,
the controller configured to:
count a number that is a first value of third data obtained by the exclusive-OR operation,
write a status fail information to the status information when a result of the count is larger than a first reference value; and
write a status pass information to the status information when the result of the count is equal to or less than the first reference value.

3. The memory device of claim 2, wherein
when the controller receives a second command set including a second command, a second address, and first setting data, the controller is configured to use a numerical value included in the first setting data as the first reference value.

4. The memory device of claim 1, wherein
when the controller receives the first command set without receiving the first prefix command, the controller is configured to:
store the first data to the first portion of the buffer region,
write the first data stored in the first portion of the buffer region to the first storage region; and
discard, after the first data is written to the first storage region, the first data stored in the first portion of the buffer region.

5. The memory device of claim 1, wherein
when the controller receives a third command set including a third command, a third address, and second setting data, the controller is configured to use a numerical value included in the second setting data as a correction value of a read voltage applied to the memory cell in the first storage region by reading the second data in the write operation.

6. The memory device of claim 1, wherein
the controller is continuously in a busy state during a period in which the first data is stored in the first portion of the buffer region and the first data stored in the first portion of the buffer region is written to the first storage region, and after the first data is written to the first storage region, the second data is read from the first storage region while the first data is maintained in the first portion of the buffer region and the read second data is stored in the second portion of the buffer region.

7. The memory device of claim 1, wherein
an output of data to an external memory controller is not executed between a period of storing the first data in the first portion of the buffer region and writing the first data stored in the first portion of the buffer region to the first storage region and a period of, and after writing the first data to the first storage region, reading the second data from the first storage region while maintaining the first data in the first portion of the buffer region.

8. The memory device of claim 1, wherein
the controller is configured to read the second data from the first storage region based on the first command set while maintaining the first data in the first portion of the buffer region.

9. The memory device of claim 1, wherein
the memory cell is configured to store a plurality of bits of data, and
the status information includes information indicating whether or not a defect is detected for each page.

10. The memory device of claim 9, wherein
when the controller executes a write operation based on the first prefix command, the controller is configured to store information, indicating whether or not a defect is detected on a first page, in the status information, and
when the controller executes the write operation based on a second prefix command different from the first prefix command, the controller is configured to store information, indicating whether or not a defect is detected on a second page different from the first page, in the status information.

11. A memory system comprising:
the memory device according to claim 1; and
the memory controller configured to transmit the first prefix command and the first command set to the memory device.

12. The memory system of claim 11, wherein
the memory cell array further includes a second storage region specified by a second address, and
the memory controller is configured to:
read the status information from the memory device after a write operation based on the first prefix command and the first command set; and
transmit a fourth command set, including the first prefix command, the first command, the second address, and the first data, to the memory device when the status information includes information of a status fail.

13. The memory system of claim 12, wherein
after the memory device transitions to a busy state based on transmission of the first command set, the memory controller is configured to read the status information from the memory device based on transition of the memory device from the busy state to a ready state.

14. The memory system of claim 11, wherein
the memory cell array further includes a third storage region specified by a third address and a fourth storage region specified by a fourth address,
the memory controller is configured to transmit a fourth command set including the first prefix command, the first command, the third address, and fourth data to the memory device after a write operation based on the first prefix command and the first command set,
the memory device is configured to execute a write operation based on the fourth command set, and
the memory controller is configured to:
instruct the memory device on a read operation of the first address and a read operation of the third address after the write operation based on the fourth command set; and
instruct the memory device on a write operation of the fourth address using fifth data obtained by the read operation of the first address and six data obtained by the read operation of the third address.

15. The memory system of claim 11, wherein
the memory controller is configured to instruct the memory device on a write operation based on the first prefix command in garbage collection to a plurality of storage regions included in the memory cell array.

16. The memory system of claim 11, wherein
the memory cell array includes a plurality of storage regions, and
the memory controller is configured to:
instruct the memory device on a write operation based on the first prefix command to a storage region of the storage regions in which a write/erase count is larger than a second reference value; and instruct the memory device on a write operation not based on the first prefix command to a storage region of the storage regions in which the write/erase count is equal to or less than the second reference value.

\* \* \* \* \*